United States Patent
Craen et al.

(10) Patent No.: US 10,001,629 B2
(45) Date of Patent: Jun. 19, 2018

(54) PIEZOELECTRICALLY ACTUATED OPTICAL LENS

(71) Applicant: Polight AS, Horten (NO)

(72) Inventors: Pierre Craen, Embourg (BE); John Phair, Tønsberg (NO); Nicolas Tallaron, Lyons (FR)

(73) Assignee: POLIGHT AS, Horten (NO)

( * ) Notice: Subject to any disclaimer, the term of this patent is extended or adjusted under 35 U.S.C. 154(b) by 0 days. days.

(21) Appl. No.: 15/325,681

(22) PCT Filed: Jul. 17, 2015

(86) PCT No.: PCT/EP2015/066491
§ 371 (c)(1),
(2) Date: Jan. 11, 2017

(87) PCT Pub. No.: WO2016/009079
PCT Pub. Date: Jan. 21, 2016

(65) Prior Publication Data
US 2017/0199357 A1     Jul. 13, 2017

(30) Foreign Application Priority Data

Jul. 18, 2014 (EP) .................................... 14177684
Jul. 18, 2014 (EP) .................................... 14177688

(51) Int. Cl.
*G02B 1/06* (2006.01)
*G02B 13/00* (2006.01)
(Continued)

(52) U.S. Cl.
CPC ......... *G02B 13/0075* (2013.01); *G02B 1/041* (2013.01); *G02B 1/11* (2013.01);
(Continued)

(58) Field of Classification Search
CPC .................................................. G02B 13/0075
(Continued)

(56) References Cited

U.S. PATENT DOCUMENTS

2011/0038028 A1    2/2011   Dharmatilleke
2012/0170134 A1    7/2012   Bolis et al.
(Continued)

OTHER PUBLICATIONS

International Search Report for PCT/EP2015/066491 dated Oct. 6, 2015.

*Primary Examiner* — James Jones
(74) *Attorney, Agent, or Firm* — Knobbe Martens Olson & Bear LLP

(57) ABSTRACT

There is presented a transparent optical device element (700) comprising an optical lens (744), comprising one or more piezoelectric actuators (206, 208, 210), wherein said optical lens (744) comprises an optical aperture (632), and wherein the optical device element furthermore comprises a passivation layer (312, 314, 742, 628) placed on said optical lens, said passivation layer comprising a barrier layer (312) forming a humidity barrier, and being located on at least a portion of said cover member, where said portion of said cover member is intersected by the optical axis, and on said piezoelectric actuators, and wherein the passivation layer furthermore comprises one or more further layers (628) located on at least said portion of said cover member being intersected by the optical axis, wherein said passivation layer forms an anti-reflection coating for said optical lens (744) at least along the optical axis (634).

20 Claims, 9 Drawing Sheets

(51) Int. Cl.
  *G02B 1/11* (2015.01)
  *G02B 1/04* (2006.01)
  *G02B 3/14* (2006.01)
  *H01L 41/09* (2006.01)
  *H01L 41/22* (2013.01)
(52) U.S. Cl.
  CPC ............... *G02B 3/14* (2013.01); *H01L 41/09* (2013.01); *H01L 41/22* (2013.01)
(58) Field of Classification Search
  USPC ........................................................ 359/666
  See application file for complete search history.

(56) References Cited

U.S. PATENT DOCUMENTS

| | | | |
|---|---|---|---|
| 2012/0300171 A1 | 11/2012 | Gupta et al. | |
| 2014/0104696 A1 | 4/2014 | Moreau et al. | |
| 2015/0338604 A1* | 11/2015 | Soman | H01L 21/32136 348/207.1 |

* cited by examiner

PIEZOELECTRICALLY ACTUATED OPTICAL LENS

CROSS REFERENCE TO RELATED APPLICATIONS

This application is a U.S. National Phase Application of PCT International Application Number PCT/EP2015/066491, filed on Jul. 17, 2015, designating the United States of America and published in the English language, which is an International Application of and claims the benefit of priority to European Patent Application No. 14177688.0, filed on Jul. 18, 2014, and European Patent Application No. 14177684.9, filed on Jul. 18, 2014. The disclosures of the above-referenced applications are hereby expressly incorporated by reference in their entireties.

FIELD OF THE INVENTION

The present invention relates to optical lenses, and more particularly a piezoelectrically actuated optical lens, and a corresponding use and method of manufacturing a piezoelectrically actuated optical lens.

BACKGROUND OF THE INVENTION

There is an ever increasing demand for low cost, high volume solutions for lens assemblies with adjustable focal length. Modern mobile phones, for example, are now equipped with miniature digital camera modules and the quality and cost demands for lenses and lens assemblies are increasing. More and more miniature cameras used in mobile phones and laptop computers have auto focus functionality. The design of lens systems for such applications requires fulfillment of a large number of requirements, from production standards to ease of operation when fitting the lens on top of a camera module. These challenges are even greater when the lens arrangement comprises tuneable parameters, such as encountered in auto focus lenses, wherein the focal length must be adjusted, for example, to fit the distance from the lens to the object to be photographed. Such lenses are usually complex designs comprising movable parts that can make it difficult to assemble the lens in a simple manner. A further challenge with such designs is the ever increasing requirements to provide suitable lens assemblies for such use.

There exist a number of solutions for making compact auto focus lens elements.

One of the problem of current solutions is how to provide a robust tuneable microlens which may be manufactured in a relatively efficient manner, yet provides good optical properties.

Hence, an improved tunable microlens would be advantageous, and in particular a tunable microlens which may be manufactured in a more efficient manner, and which may be more robust and/or more reliable would be advantageous.

SUMMARY OF THE INVENTION

It may be seen as an object of the present invention to provide a transparent optical device element, such as a tunable microlens, that solves the above mentioned problems of the prior art.

It maybe seen as a further object of the present invention to provide an alternative to the prior art.

Thus, the above described object and several other objects are intended to be obtained in a first aspect of the invention by providing a transparent optical device element, such as a tunable optical lens, such as a tuneable optical microlens, comprising:

a. An optical lens (744), comprising
 i. at least one deformable lens body (640) surrounded by a sidewall (602),
 ii. a bendable transparent cover member (104) attached to a surface of said at least one deformable lens body,
 iii. one or more piezoelectric actuators (206, 208, 210) arranged for shaping said cover member, such as the portion of the cover member being in the optical aperture, such as for shaping a portion of the cover member being intersected by the optical axis, into a desired shape, such as said piezoelectric actuators located above and/or below, such as on a top and/or a bottom surface, of said cover member, such as the piezoelectric actuators comprising piezoelectric actuators being located on the same and/or the opposite side of the cover membrane as the passivation layer,
wherein said optical lens (744) comprises an optical aperture (632) with an optical axis (634), wherein the optical axis intersects the lens body and the cover member, and wherein the piezoelectric actuators are defining the optical aperture, such as being arranged so as to surround or encircle the optical aperture, such as being placed immediately adjacent but not within the optical aperture,
b. a passivation layer (312, 314, 742, 628) placed on said optical lens, said passivation layer comprising multiple sublayers including:
 i. a barrier layer (312), said barrier layer forming a humidity barrier, and being located on:
  1. at least a portion of said cover member, where said portion of said cover member is intersected by the optical axis, and
  2. said piezoelectric actuators,
 i. one or more further layers (628) located on at least said portion of said cover member being intersected by the optical axis, such as on at least said portion of said cover member being intersected by the optical axis and at least partially on the piezoelectric actuators, such as above:
  1. said a portion of said cover member, and
  2. said piezoelectric actuators,
 and arranged for improving an anti-reflecting property of the passivation layer,
wherein said passivation layer forms an anti-reflection coating for said optical lens (744) at least along the optical axis (634) such as so as to provide a transparent optical device element with sufficient mechanical, electrical and optical properties for functioning as a tuneable lens in atmospheric conditions.

In a more general embodiment, there is presented:
b. An optical lens, comprising
 i. at least one deformable lens body surrounded by a sidewall,
 ii. a bendable transparent cover member attached to a surface of said at least one deformable lens body,
 iii. one or more piezoelectric actuators arranged for shaping said cover member into a desired shape, such as said piezoelectric actuators located above and/or below, such as on a top and/or a bottom surface, of said cover member, such as the piezoelectric actuators comprising piezoelectric actuators being located on the same and/or the opposite side of the cover membrane as the passivation layer, wherein said optical lens comprises an optical aperture with an optical axis, wherein the optical axis intersects the lens body and the cover member,
c. a passivation layer placed on said optical lens, said passivation layer comprising multiple sublayers including:
  i. a barrier layer, said barrier layer forming a humidity barrier, and being located on:
    1. at least a portion of said cover member, where said portion of said cover member is intersected by the optical axis, and
    2. said piezoelectric actuators,
  ii. one or more further layers located on at least said portion of said cover member being intersected by the optical axis, such as on at least said portion of said cover member being intersected by the optical axis and at least partially on the piezoelectric actuators, such as above:
    1. said a portion of said cover member, and
    2. said piezoelectric actuators,
wherein said passivation layer forms an anti-reflection coating for said optical lens at least along the optical axis, such as so as to provide a transparent optical device element with sufficient mechanical, electrical and optical properties for functioning as a tunable lens in atmospheric conditions.

The invention is particularly, but not exclusively, advantageous for obtaining a tunable microlens which may be manufactured in a more efficient manner, and which may be more robust and/or more reliable. The present inventors have made the insight, that it may be possible to integrate a humidity barrier layer into an anti-reflection coating, which in turn enables that a humidity barrier layer may be added to both an aperture area and actuator areas in a single or few processing steps. Furthermore, it may be seen as an advantage, that good optical properties of the device element may be achieved by integrating the humidity barrier layer into an anti-reflection coating. Still further, it may be seen as an advantage that good properties in general may be achieved by a device element according to the first aspect, such as good electrical, mechanical and/or optical properties.

In a specific embodiment, which may be particularly simple, the composition of the passivation layer (such as sequence and type and thicknesses of sublayers in the passivation layer) along the optical axis, is comprised within or is similar to, such as identical to, a composition of the passivation layer along a (virtual) line parallel with the optical axis and intersecting a piezoelectric actuator.

It may be understood, that this passivation combination layer may advantageously be optimized for other requirements of the lens such as being of sufficiently (ultra) low stress not to affect the functioning and/or performance of the optical lens, such as a TLens® (poLight, Norway). If there is a possibility to tune the stress of the layer by deposition conditions then this can be done to ensure the best performance.

In addition to the barrier properties of the passivation layer, it may also be advantageous to cover the optical aperture with an anti-reflective coating in order to provide optimal optical performance (such as high transmittance along the optical path, such as >95% average transmittance in the visible range 350-700 nm). This may be achieved by combining the barrier layer with the one or more further layers. Since both of these layers (i.e., the barrier layer and the one or more further layers) may advantageously be implemented in the passivation layer it may be advantageous to combine features of them so that one layer does not have a negative impact on the other. For instance, an optically good coating may not necessarily have a good moisture protection property while a good moisture protection barrier may not necessarily have good optical properties. While separate layers can be patterned according to their functionality, this adds complexity and cost to the process which is disadvantageous. The present invention may be seen as advantageous, since it provides a solution, which enables providing a passivation layer, which may cover the entire lens (i.e., both aperture and actuators) and which combines the required chemical/physical barrier properties with the required optical properties. It may be noted, that in an embodiment which may be seen as simple and advantageous, each of the barrier layer and the one or more further layers are placed on both the aperture (such as being intersected by the optical axis) and the piezoelectric actuators (such as enabling protecting the piezoelectric actuators from humidity). In a more specific embodiment, the passivation layer, has a similar, such as an identically similar, composition along the optical axis and above the piezoelectric actuators.

By 'a transparent optical device element' is understood an element which is transparent, and which is suitable for an optical device, such as a camera or a scanner or variable optical tuner or attenuator, such as for being placed in the optical path of an optical device.

'Optical lens' is known in the art and understood accordingly. 'Optical' is understood as relating to 'light'. The optical lens may be a tuneable micro-lens known as a TLens® obtainable from the company poLight, Norway. The optical lens may be a tuneable micro-lens corresponding to the micro-tuneable lens disclosed in the patent application WO2008100154 (A1) with the title "Flexible lens assembly with variable focal length".

'Light' is understood to correspond to electromagnetic variation within a wavelength range corresponding to the visible region (which humans perceive or see as 'light'), such as within 350-700 nm. 'Optical' is to be understood as relating to light.

'Transparent' is understood with reference to light, i.e., light may pass through a transparent object, with little or no intensity loss, such as losing 10% or less, such as 5% or less, when passing through the material.

'Aperture' is commonly known in the art, and is to be understood as such, in particular as an optically transparent aperture with respect to visible light. It is furthermore understood, that the optically transparent 'aperture' is delimited by an opaque material (such as opaque piezoelectric actuators), since an aperture is generally understood to be an opening that limits the quantity of light that can enter an optical instrument. By 'opaque' may be understood an average transmittance of 10% or less, such as 1% or less, such as 0.1% or less, for light travelling through the opaque material in a direction parallel with the optical axis 'Optical axis' is commonly understood in the art, and is understood to intersect the lens body and the cover member, such as pass through the lens body and the cover member. In the present context, the piezoelectric actuators may be defining the optical aperture of the at least one deformable lens body on the bendable transparent cover member, such as the piezoelectric actuators being arranged so as to surround or encircle the optical aperture.

The lens body may be a deformable, such as relatively soft with respect to the piezoelectric actuators, transparent material, such as a polymer. By 'deformable' may be understood that an element, such as the lens body, is deformable by the piezoelectric actuators, i.e., actuation of the piezoelectric actuators may deform the element, such as enabling controlling the deformation via the piezoelectric actuators.

By 'sidewall' may be understood a support element, which at least partially supports the bendable transparent cover member, such as supports the bendable transparent cover member in a region immediately outside or close to the optical aperture.

The bendable transparent cover member may be relatively thin, such as thin with respect to the lens body in a direction along the optical axis, e.g. less than 1 mm, such as less than 0.75 mm, such as less than 0.5 mm, such as [10; 40] micrometer (i.e., within 10-40 micrometer). It may be made of glass or other material such as ceramic-glass, polymer, polymer-inorganic hybrid, such as being a so-called cover glass or being similar to a cover glass. By 'bendable' may be understood that an element, such as the bendable transparent cover member, may be bend by the piezoelectric actuators, i.e., actuation of the piezoelectric actuators may bend the element. The 'bendable transparent cover member' may be referred to interchangeably with "cover member", "cover membrane" and "membrane".

'Piezoelectric actuators' are known in the art, and are in the present context understood to include electrode layers in their various configurations, such as an electrode (e.g., platinum) layer on each side (such as above and below) of a piezoelectric material, or an electrode layer only on one side (such as above or below) of the piezoelectric material, such as an electrode layer comprising interdigitated electrodes, such as interdigitated electrodes described in the reference WO 2014/048818 A1 which is hereby included by reference in entirety. By 'arranged for shaping said cover member into a desired shape', may be understood that the shape, size and position of the actuators relative to the cover member enables them upon actuation, such as upon an applied voltage across their electrodes, to deform and thereby shape said cover member into a desired shape'. It is understood, that at least a portion of the cover member being in the optical aperture, such as the portion of the cover member being intersected by the optical axis is being shaped into a desired shape. 'Cover member' may be used interchangeably with 'bendable transparent cover member'. By 'desired shape' may be understood that when going from a shape to a desired shape, then the focal length of the lens changes. In some embodiments the piezoelectric actuators enable a tuning of a curvature of the cover member between a radius of curvature of −200 mm and +200 mm such as between −100 mm and +100 mm. In general, the radius of curvature at a given point is the radius of a circle that mathematically best fits the curve at that point.

By 'passivation layer' may be understood a layer comprising multiple sublayers, and it may be understood that said passivation layer makes the optical lens more "passive" that is, less affected by environmental factors such as water. This may be advantageous for increasing reliability of the optical lens. The 'passivation layer' also forms an anti-reflection coating for said optical lens at least along the optical axis. By 'anti-reflection coating' is understood a coating of the optical lens which reduces the average reflection of the optical lens with respect to the optical lens without the coating, i.e., without the passivation layer.

In an embodiment, the passivation layer comprises no electrically conducting material in the optical aperture. An advantage of this may be that the transmittance does not suffer from electrically conducting material (which typically have higher absorption co-efficients than an electrically non-conducting material) in the optical aperture.

The 'passivation layer' may furthermore form an electrical barrier. In other words, the 'passivation layer' is electrically isolating (even if it comprises electrically conducting layers (e.g., in some regions outside the optical aperture). It may be understood, that the mechanical properties of the lens allow the optical lens to function, i.e., the passivation layer does not mechanically inhibit the piezoactuated tunability of the lens. In general, it is noted that the passivation layer (including the barrier layer, optional electrically conductive layers, the one or more further layers), may not significantly negatively impact the basic functioning and performance of the optical lens. For example, there may accordingly be presented embodiments wherein:

the stresses are not be too high to impact the curvature of the cover member so it can not properly be actuated, and/or the materials in the passivation layer are not be too hard (such as having a Mohs hardness greater than 9 and/or being scratch resistant), stiff and/or thick to prevent the natural movement of the membrane etc. including inducing unwanted optical distortions.

The 'passivation layer' may therefore enable the providing of a transparent optical device element with sufficient mechanical, electrical and optical properties for functioning in practical circumstances as a tunable lens in atmospheric conditions.

By 'barrier layer' may be understood a layer which forms a barrier for an element, such as a humidity barrier which forms a barrier for water. It may be understood, that a barrier layer forms a barrier between a volume on one side of the barrier and a volume on the other side of the barrier. For example, a barrier layer on a piezoelectric transducer forms a barrier between the piezoelectric transducer and the volume on the other side of the barrier, such as the surroundings.

It may be understood, that the barrier layer is not electrically conducting. An advantage thereof may be that the barrier layer can then be placed everywhere (on the optical aperture and on piezoelectric actuators defining the optical aperture, without necessitating that an electrically conductive material is placed in the optical aperture, which would degrade the optical properties).

In the present context, the passivation layer may be understood to be a layer related to protecting a class of commonly used inorganic oxide piezoactuators, such as PZT, PNZT, PLZT, PLT, PNLZT, etc., including ferroelectric relaxors such as PZN-PT, PMN-PT, PSN-PT, PYbN-PT, etc, and non-lead containing materials such as BT, BST, NBT, KBT, KNN, KMN, BFO and systems thereof such as NBT-KBT, NBT-KNN, NBT-BT, NBT-BFO, KBT-BT, KNN-BT, KNN-KCNx, etc., and the specific degradation issues related to its unique physicochemical nature of the oxides PZT and its electrodes (e.g. Pt, Ru, Ir, Ag, Au, TiW), particularly if the electrode has catalytic properties e.g. Pt. It may be considered advantageous if the passivation layer and/or the barrier layer forms a stable and robust barrier to hydrogen and $H_2O$ in their various forms.

The 'barrier layer' may yield a water vapour transmission rate (WVTR) value of less than $10^{-2}$ $g/m^2/day$, such as less than $10^{-3}$ $g/m^2/day$, such as less than $10^{-4}$ $g/m^2/day$.

The 'barrier layer' is not necessarily one unique layer, but may comprise multiple sublayers. In embodiments, the barrier layer comprises multiple sublayers. This may be advantageous for forming a barrier with respect to multiple elements/species (such as water and hydrogen) which may not necessarily be achieved by a single, unique, homogeneous layer.

The barrier layer may in general also form an electrical barrier, such as a barrier for preventing the transportation across the barrier of any charged particle that could cause a short circuit or any other electrical degradative mechanism.

It may be understood that the 'barrier layer' may in embodiments be dense, where 'dense' may be understood as 'fully covering' the piezoelectric actuators and optionally electrode surface areas.

It may furthermore be understood, that the barrier layer may have low porosity, such as the porosity being less than 1.0 vol %, such as less than 0.5 vol %. An advantage of this may be that it facilitates, such as enables, preventing transmission of potentially degrading species, such as hydrogen and/or water.

The 'barrier layer' may advantageously be coated by a conformal deposition method and/or be thick enough in order to cover any exposed part of the piezoelectric actuators and optionally electrodes, such as areas which may be difficult to coat, such as sidewalls or other recessed areas. The barrier layer may advantageously have no or very low (such as 1 wt % or less) hydrogen content.

By 'one or more further layers' may be understood a single or a plurality of further layers. An advantage of the one or more further layers may be, that they may endow an improvement of an anti-reflecting property of the passivation layer. The one or more further layers may be understood to each be above the barrier layer.

It may in general be understood, that any layer in the present context are relatively thin, such as the in-plane dimension being larger than the out-of-plane dimension, where the out-of-plane dimension may be parallel with the optical axis. By 'placed on' or 'located on' may be understood that one layer or element is placed on another layer or element, such as the layers or elements overlapping when observed in the out-of-plane dimension. Thus, 'placed on' and 'located on' may be used interchangeably, and may furthermore be used interchangeably with 'located above' and 'placed above'. It is encompassed, though, that a layer or element placed on another layer or element, may or may not be in direct contact, i.e., there may or may not be an intermediate layer. It may in general be understood, that when a layer within the passivation layer is placed on the cover member, then it is placed on a portion of the cover member being intersected by the optical axis, such as on a portion of the cover member corresponding to the optical aperture. When a direction is implied, such as when using the terms 'above' or 'below' or 'top' or 'bottom', it is in general understood that a positive direction is defined in a direction from the lens body to the cover member. For example, the cover member is above the lens body such as on top of the lens body. It may be understood that the passivation layer is on the opposite side of the cover member than the lens body. Thus, the passivation layer is above the cover member, such as on top of the cover member. A first layer in the passivation layer which is above or on top of a second layer, is further away from the lens body than the second layer.

It may be understood that a layer 'placed on' or 'located on' another layer or element may not necessarily fully cover the other layer or element, such as may cover the other layer or element only partially, such as may cover only a portion of the other layer or element. In embodiments, the other layer may be fully covered.

In an embodiment there is provided a transparent optical device element, wherein the passivation layer comprises (see FIG. 18 or FIG. 19):

a primary sublayer being located on said cover member, where the primary sublayer is intersected by the optical axis, and one or more secondary sublayers being located on said cover member, such as on both sides of the primary sublayer, where the one or more secondary sublayers are intersected by the optical axis, and wherein the primary sublayer is thicker than each of the one or more secondary sublayers, such as a least two times thicker, such as at least three times thicker, such as at least four times thicker, such as at least 5 times thicker, such as at least 7.5 times thicker, such as at least 10 times thicker, and wherein the primary sublayer is layer is placed between:

at least a portion of said cover member, and at least a portion of the one or more secondary sublayers.

Each group of secondary sublayers (such as the group of one or more secondary sublayers above the primary sublayer and/or the group of one or more secondary sublayers below the primary sublayer) may be considered a sub-antireflective coating with reference to the primary sublayer. By 'sub-antireflective coating' may be understood one or more layers which overall improves an anti-reflecting property of the passivation layer, i.e., the presence of these one or more layers results in a smaller reflection coefficient for light along the optical axis of the passivation layer and therefore of the transparent optical device.

The primary sublayer may be thicker than each of the one or more secondary sublayer, such as the group of one or more secondary sublayers, so that it may be considered as a bulk substrate for the purposes of the optical function and optical performance of the one or more secondary sublayers and/or so that it does not impact or interfere with the optical performance of the one or more secondary sublayers. It may in general be understood, that the primary sublayer is relatively thick with respect to each of one or more secondary sublayers. It may in general be understood, that each of the secondary sublayers is relatively thin with respect to the primary sublayer. Therefore, the 'primary sublayer' may be referred to interchangeably with 'relatively thick sublayer'. The 'secondary sublayer(s)' may be referred to interchangeably with 'relatively thin sublayer(s)'.

An advantage of this may be, that the primary sublayer can be of a varying thickness or tolerate processing induced thickness variations. An advantage of this or another advantage may be, that the primary sublayer may be placed in a position in the passivation layer, wherein during processing it is exposed to various steps, such as etching steps, which main entail that the primary sublayer will suffer thickness reduction, which may not be easily controllable (i.e., introduce thickness variations which, although they may be relatively small on an absolute scale, may influence the optical properties, in particular if the affected layer is relatively thin). However, since the primary sublayer is relatively thick, such as relatively thick with respect to each of one or more secondary sublayers, these possible somewhat uncontrollable thickness variations may to some extent be absorbed by the primary sublayer, since the relative thickness variations are relatively small, compared to a situation where a (thinner) secondary sublayer suffered from the same (on an absolute scale) thickness variations. In particular, optical layers (such as layers being intersected by the optical axis in the finished optical element) which have additional layers deposited on top of it during manufacture, which additional layers need to be removed, will inadvertently suffer thickness reduction when these layers are removed. This may advantageously be compensated by design so that the anti-reflection coating (ARC), such as the complete anti-reflection coating (ARC) on the bendable transparent cover membrane, (where ARC is understood to denote the portion of the passivation layer located above the aperture, such as the portion of the passivation layer which may be intersected by optical rays which also intersect the aperture during normal use of the lens, such as so as to be traversed at least by the optical axis) is not too sensitive to thickness variations of some or all layers within the stack, particularly when layers deposited on top of it are removed. This may be achieved by having a primary sublayer, which may suffer from thickness variations during manufacture, and then one or more (thinner) secondary sublayers above it, which secondary sublayers may improve the optical properties.

Two specific examples of how this can be realized are given below:
1. The first two layers of the passivation layer/ARC are deposited on the transparent cover membrane with the first layer (e.g., the barrier layer) being relatively thin (<100 nm) and the second layer relatively thick (>300 nm, such as >500 nm, such as >1000 nm). The second layer—the primary sublayer—is designed to absorb thickness variations due to the deposition of multiple additional layers such as conducting electrodes and stress compensation layers and their removal (and overetch). The ARC may be simulated to include expected thickness variations of this layer in its performance assessment. One or more secondary sublayers are then placed in the portion of the ARC above the second primary sublayer above the aperture.
2. The first two layers of the passivation/ARC are deposited on top of the piezoelectric actuator with the first layer (e.g., the barrier layer) being relatively thin (<100 nm) and the second layer relatively thick (>300 nm, such as >500 nm, such as >1000 nm). The second layer—the primary sublayer—is designed to absorb thickness variations due to the deposition of multiple additional layers such as conducting electrodes and stress compensation layers and their removal (and overetch). The ARC is simulated to include expected thickness variations of this layer in its performance assessment.

In an embodiment, the primary sublayer is also located below other layers added (which other layers may be referred to as 'intermediate layers'), such as metal contact layers and/or stress compensation layers, such as under all (thinner) secondary sublayers and under other layers added, such as metal contact layer and/or stress compensation layers (see FIG. 19). By 'stress compensation layer' is understood a layer with a built-in stress, which compensates for stress elsewhere in the device. The stress compensation layer may be realized via the 'structure element' referred to elsewhere in the present application. Thus, the structure element may be but is not limited to being a stress compensation layer. The compensation stress layer may vary in stress from −600 to +600 MPa and thickness of 0.01 to 10 μm (micrometers).

In an embodiment there is provided a transparent optical device element, wherein the passivation layer is arranged so as to form a hydrogen barrier covering at least a portion of the piezoelectric actuators, such as totally covering the piezoelectric actuators, such as at least a portion of the piezoelectric actuators and said portion of said cover member being intersected by the optical axis, such as totally covering both of the piezoelectric actuators and said cover member. Implementing a hydrogen barrier may be carried out in different ways, e.g., by implementing a barrier layer which is both a moisture barrier and a hydrogen barrier, and/or by adding a separate layer which may form a hydrogen barrier. An advantage of adding a hydrogen barrier may be, that it dispenses with the need for selecting materials (such as electrode materials) which are capable of withstanding hydrogen and/or that processes (such as during manufacturing) can be employed where hydrogen is present.

By 'hydrogen barrier' is understood a barrier, which disallows diffusion of hydrogen through the barrier or allows diffusion of only small amounts at such a slow rate that its presence is considered to be insignificant, such as a hydrogen permeability (given in units of moles-$H_2$ $m^{-2}$ $sec^{-1}$) less than $1\times10^{-10}$, such as less than $1\times10^{-12}$, such as less than $1\times10^{-15}$. It is understood that all of the stated hydrogen permeability values are defined at standard atmospheric conditions, in atmospheric air and at standard ambient temperature, such as 20 degree Celcius, and pressure, such as 100 kPA, and at 50% relative humidity.

In exemplary embodiments, such hydrogen barriers may be realized by any one of: Aluminium oxide, silicon oxide, silicon oxynitride, tantalum oxide, hafnium oxide, titanium carbide, titanium nitride, silicon carbide, boron nitride, tantalum nitride, titanium aluminium nitride, or titanium aluminium oxynitride, for example, aluminium oxide with a thickness of 20 nm or titanium nitride with a thickness of 100 nm.

In an embodiment there is provided a transparent optical device element, wherein one or more areas of the passivation layer above the one or more piezoelectric actuators comprise an electrically conductive layer, such a metal layer, such as Au or AlCu, such as a layer comprising Au/TiN or Au/TaN or AlCu/TiN, enabling electrically accessing the one or more piezoelectric actuators, and/or a stress compensation layer, wherein said electrically conductive layer and/or said stress compensation layer is placed between:
 at least a portion of the barrier layer
 and
 at least a portion of the one or more further layers.

An advantage of this may be that the optical lens may be protected by the barrier layer during the processing related to the electrically conductive layer and/or said stress compensation layer, while the one or more further layers via their position may be deposited after said processing and hence do not suffer therefrom.

Alternatively, said electrically conductive layer is placed in the top of the passivation layer, such as said electrically conductive layer being placed further away from the cover member than the other layers, such as all other layers, in the passivation layer. In an embodiment there is provided a transparent optical device element, wherein one or more areas of the passivation layer above the one or more piezoelectric actuators comprise an electrically conductive layer, such a metal layer, such as Au or AlCu, such as a layer comprising Au/TiN or Au/TaN or AlCu/TiN, enabling electrically accessing the one or more piezoelectric actuators, wherein said electrically conductive layer is placed above:
 at least a portion of the barrier layer,
 and
 at least a portion of the one or more further layers.

In a further embodiment, the passivation layer furthermore comprises a stress compensation layer being placed below the electrically conductive layer.

In an embodiment there is provided a transparent optical device element, wherein one or more areas of the passivation layer above the one or more piezoelectric actuators comprise an electrically conductive layer, enabling electrically accessing the one or more piezoelectric actuators, and/or a stress compensation layer (742), wherein said electrically conductive layer and/or said stress compensation layer (742) is placed between:
  at least a portion of the barrier layer and the primary sublayer,
  and
  at least a portion of the one or more secondary sublayers.

In an embodiment there is provided a transparent optical device element, wherein one or more areas of the passivation layer above the one or more piezoelectric actuators comprise a stress compensation layer, wherein said stress compensation layer is placed between:
  at least a portion of the barrier layer
  and
  at least a portion of the one or more further layers.

In an embodiment there is provided a transparent optical device element, further comprising at least one structure element (742) located onto said piezoelectric actuators (206, 208, 210) and surrounding said optical aperture (632);
  wherein said at least one structure element (742) has an external diameter between a diameter of the bendable transparent cover member (104) and a diameter of said optical aperture (632); and
  wherein said bendable transparent cover member (104) is adapted to provide mechanical stability to the transparent optical device element (700) and to allow for tuning of the curvature of the bendable transparent cover member (104) between a negative radius of curvature and a positive radius of curvature.

The basic idea of the 'structure element' is to provide a transparent optical device, such as a tunable microlens, with a structure element that provides mechanical and thermal stability and tunability of the curvature of a bendable transparent cover member located on a deformable lens body, where the shape, size and position, i.e. extension of the structure over the underneath layers determines the tunability of the curvature of the deformable lens body. It is noted, that such 'structure element' may in particular be advantageous in combination with a passivation layer as described in the independent claims of the present invention, because such passivation layer and its method of formation enables integrating a 'structure element' into the device while mitigating any negative influences in terms of optical properties and sensitivity to processing and atmospheric conditions, which may otherwise be the result of the processing related to such a structure element. It is noted, that the at least one structure element may be implemented in various shapes and sizes, which may be optimized depending on the objective, hence the structure element may be referred to as variable structure element.

In an embodiment there is provided a transparent optical device element, wherein said at least one deformable lens body comprises polymer. In an embodiment there is provided a transparent optical device element, wherein said at least one deformable lens body comprises a polymer network of cross-linked or partly cross-linked polymers and a miscible oil or combination of oils. In an embodiment there is provided a transparent optical device element, wherein said at least one deformable lens body may have an elastic modulus larger than 300 Pa, a refractive index is above 1.35, and an absorbance in the visible range less than 10% per millimeter thickness.

In an embodiment there is provided a transparent optical device element, wherein said at least one structure element is a thermal compensation layer, such as a layer having the function of providing compensation to the thermal expansion induced by temperature changes in the multiple layers structure of the transparent optical device element. The specific structure element is thus not a strengthening layer but may be a thermal compensation layer that can be tuned to provide thermal compensation to the transparent optical device element.

In an embodiment there is provided a transparent optical device element, wherein said at least one structure element has a thickness between 0.03 µm and 10 µm.

In an embodiment there is provided a transparent optical device element, wherein said tuning of the curvature is between a radius of curvature of −200 mm and of +200 mm.

In a further embodiment there is provided a transparent optical device element, wherein the electrically conductive layer is forming a hydrogen barrier and/or a humidity barrier. An advantage of this may be, that at a point of electrical contact to the piezoelectric actuators, where the barrier layer may be penetrated by the electrically conductive layer, the piezoelectric actuators will not suffer from exposure to hydrogen and or humidity. In an embodiment, the electrically conductive layer comprises a metal nitride, such as TiN, TiC, TaC, TaN, TiAlN or TiAlON for providing a humidity and hydrogen barrier.

The electrically conductive layer may comprise, such as consist of, a material which for practical purposes is non-oxidisable material, such as being non-oxidisable. An advantage of this may be that it may be enabling direct electrical mounting of the device without the need for additional layers or materials to form a reliable electrical contact.

In an embodiment there is provided a transparent optical device element, wherein said passivation layer further comprises an electrically conductive metal nitride layer at least partially covering the one or more piezoelectric actuators, such as forming a barrier to hydrogen and moisture. The metal nitride may be any one metal nitride selected from the list comprising, such as consisting of: TiN, TiC, TaC, TaN, TiAlN, and TiAlON.

In an embodiment, which may be combined with any other embodiment, there is provided a transparent optical device element, wherein said barrier layer comprises one or more materials chosen from the group comprising, such as consisting of:
  metal oxides, such as any one of: $Al_xO_y$ (where x and y each correspond to a real number between 0 and 5, such as x=2 and y=3), $Al_2O_3$, $ZrO_2$, $TiO_2$, $TiO_2C$, $BaTiO_3$, $SrTiO_3$, HfO, $Ta_2O_5$,
  carbides, such as: SiC, SiOC,
  metalloid oxides, such as: $SiO_2$, SiOF, $GeO_2$, SiON,
  fluorides, such as any one of: $LiF_2$, $MgF_2$, $ThF_4$, $CeF_3$, $PbF_2$
  sulphide, such as any one of: ZnS,
  selenides, such as: ZnSe,
  other oxides, such as any one of: MgO, $Y_2O_3$, $Sc_2O_3$, $CeO_2$, $Nb_2O_5$,
  or nano-laminates (meaning multi-layer structure with individual layer thicknesses less than 100 nm, such as less than 10 nm) of two or more of the materials above, The barrier layer according to the present embodiment may yield a water vapour transmission rate (WVTR) value of less than $10^{-2}$ g/m$^2$/day, such as less than $10^{-3}$ g/m$^2$/day, such as less than $10^{-4}$ g/m$^2$/day.

In an embodiment there is provided a transparent optical device element, wherein the barrier layer is completely covering the piezoelectric actuators including sides of the one or more piezoelectric actuators.

In an embodiment there is provided a transparent optical device element, wherein said transparent optical device element, such as the transparent optical device element with the passivation layer, has an average transmittance of 95% or more, such as 98% or more, such as 99% or more, for light travelling along the optical axis. An advantage of this may be that it facilitates that less light is lost when travelling through the optical device element, such as the optical device with the passivation layer. In general embodiments, said transparent optical device element, has an average transmittance of 90% or more, such as 92% or more, such as 93% or more, such as 94% or more.

By 'transmittance', such as the specular transmittance or regular transmittance, may in the present context of transmittance with respect to the transparent optical device element, such as the transparent optical device element with the passivation layer, be understood the ratio between Light being incident on the transparent optical device element along the optical axis, and
a portion of the light being incident on the transparent optical device element, which portion is transmitted through the transparent optical device element and emitted on the other side as specularly (regularly) transmitted light.

It may in general be understood when referring to optical properties within this application, that the optical property applies for light travelling along the optical axis, such as through the optical aperture, such as at an incidence angle within an angle of 0-40° with respect to the optical axis, such as at wavelength within 350-700 nm. When referring to 'average' of an optical property, it is understood as an average of said property for wavelengths within 350-700 nm.

The optical requirements for the barrier layer could extend to any layer of the passivation which is in the optical path and used to form the anti-reflective coating.

In an embodiment there is provided a transparent optical device element, wherein said transparent optical device element, has an average transmittance of 95% or more, such as 98% or more,
a minimum transmittance over the visible range is 94% or more (measured on 5 nm bandwidth or below), and/or wherein
an average reflectivity over the visible range is 2.5% or less, such as 1% or less.

For an ARC film to be achieved of the stated performance specification above, it may be considered advantageous that the optical properties of each individual layer in the stack, for example the one or more further layers, for example the primary sublayer and/or the one or more secondary sublayers, such as in the portion of the passivation layer being intersected by the optical axis, are given by one or more of, such as all of, the following properties (as is the case in some or all embodiments):

The average absorption coefficient (k) must preferably be less than 0.01 cm$^{-1}$, such as 0.001 cm$^{-1}$, across the visible light spectrum, and optionally with no sharp peak variations above this value,
the refractive index (RI): The layers must preferably fall into either one of two or possibly more categories of RI, which typical differ by greater than 0.2, such as greater than 0.3 such as greater than 0.4 for the purposes of being able to design a high performance ARC over the useful optical wavelength region by simulation. For example, there may be two categories of RI such that they have either a high RI (e.g. n>1.5) or low RI (e.g. n<1.5) with the difference between the two values being 0.2 or greater,
the relative thickness variation of each layer across the layer must be less than 10%, such as less than 5%, such as less than 2.5%.

In an embodiment, which may be combined with any other embodiment, there is provided a transparent optical device element, wherein the one or more further layers, such as the primary sublayer and/or the one or more secondary sublayers, comprise one or more materials chosen from the group comprising, such as consisting of:

metal oxides, such as any one of: $Al_xO_y$ (where x and y each correspond to a real number between 0 and 5, such as x=2 and y=3), $Al_2O_3$, $ZrO_2$, $ZnO$, $TiO_2$, $TiO_2C$, $BaTiO_3$, $SrTiO_3$, $HfO$, $Ta_2O_5$, $In_2O_2$, $La_2O_3$
carbides, such as: SiC, SiOC,
metalloid oxides, such as: $SiO_2$, SiOF, $GeO_2$, SiON,
fluorides, such as any one of: $LiF_2$, $MgF_2$, $ThF_4$, $CeF_3$, $PbF_2$
sulphide, such as any one of: ZnS,
selenides, such as: ZnSe,
other oxides, such as any one of: MgO, $SnO_2$, $FeO_2O_3$, $MnO_e$, $Y_2O_3$, $Sc_2O_3$, $CeO_2$, $Nb_2O_5$, $Er_2O_3$
plasma-polymerized materials such as plasma-polymerized hydrocarbons (PPHCs), plasma-polymerized organosilicones (PPOSs), and plasma-polymerizes fluorocarbons (PPFCs)
polymer materials such as polyacrylate (PMMA), parylene, polyethylene, polypropylene, polystyrene, poly(ethylene terphhthalate), poly(ethersulfone), polyethylene napthalate, polyimide and variants thereof
amorphous carbon, diamond-like carbon, graphene or other alltropes of carbon
porous (<98% density, such as less than 90% density, such as less than 60% density, such as less than 40% density) or microstructurally-morphologically altered (for example, surface altered with nano-microspikes or nano-microballs)

In a specific embodiment, the one or more further layers comprise $SiO_2$ as low refractive index material and SiON as a high refractive index material for the ARC, while another specific embodiment has $SiO_2$ as low refractive index material and SiOC, $Al_2O_3$, HfO, $TiO_2$ or $Ta_2O_5$ as the high refractive index material. The relative thicknesses, number of layers and sequences of layers can be determined by optical simulation for specific layer data (n,k values) and defined optical interfaces of bottom surface and top surface.

In an embodiment there is provided a transparent optical device element, wherein said passivation layer has an average absorption coefficient k, which is 0.01 cm$^{-1}$ or less, such as 0.001 cm$^{-1}$ or less,
and/or
a reflectivity which is 2.5% or less, such as 1% or less, for light travelling along the optical axis.

Having a low absorbance and/or a low reflectance may be beneficial in itself, and because these low values may serve to enhance transmittance.

In an embodiment there is provided a transparent optical device element, wherein said passivation layer facilitates that the device can be operational in ambient conditions (such as conditions comprising temperature variations within −20° C. to +90° C., pressure variations within 2-200 kPa, and humidity variations within 0-90%), such as said passivation layer being substantially impenetrable, such as impenetrable for practical purposes, such as impenetrable, to water, such as said passivation layer being substantially impenetrable, such as impenetrable for practical purposes, such as impenetrable, to water and hydrogen.

It may be understood, that the passivation layer facilitates, enables, and/or allows that the transparent optical device element may:
  Pass (such as operate normally after) 1000 hours at 85° C. and 85% relative humidity under operational bias, such as without a degradation of the performance of the piezoelectric actuator, such as maintaining the nominal performance of one or more, such as all of, the following attributes (where "drift" is to be understood as "deviation from original value"):
    a. Optical attributes, such as:
      i. transmittance, such as drift <2%,
      ii. wavefront error, such as drift <10% of initial value
      iii. optical range, such as drift <5% of initial range, and/or
      iv. membrane radius of curvature at 0 V (offset), such as drift <10% of initial offset,
    b. Mechanical attributes, such as:
      i. membrane strength, such as pass drop test, and/or
      ii. device integrity, such as maintain full functionality,
    c. Electrical attributes, such as:
      i. capacitance, such as drift <10% of initial capacitance,
      ii. leakage current, such as drift <10% increase of initial leakage current, and/or
      iii. Normal electrical contact and function.

Transmittance may be measured on a fully assembled transparent optical device element by a UV-Vis spectrophotometer. Optical range and wavefront error may be measured by a Shack-Hartmann wavefront sensor. Membrane curvature may be measured by a white-light interferometer. Electrical measurements may be made using standard electrical test equipment.

In an embodiment there is provided a transparent optical device element, wherein said passivation layer, such as said barrier layer, enables forming a humidity barrier wherein:
  the water vapour transmission rate (WVTR) is below $10^{-1}$ g/m$^2$/day, such as below $10^{-3}$ g/m$^2$/day, such as below $10^{-4}$ g/m$^2$/day, such as below $10^{-5}$ g/m$^2$/day,
and/or wherein
  the Oxygen transmission rate (OTR) is below $10^{-1}$ scc/m$^2$/day, such as below $10^{-3}$ scc/m$^2$/day, such as below $10^{-6}$ scc/m$^2$/day,
when the device element is placed at standard atmospheric conditions, such as placed in atmospheric air and at standard ambient temperature (20 degree Celcius) and pressure (100 kPA) and at 50% relative humidity (RH). It is generally understood when referring to WVTR or OTR values, that a measurement thereof is subject to these conditions, and furthermore that the barrier and both sides are kept at the same temperature and that one side is kept at 50% RH while the other is kept at near zero RH, such as less than 1% RH, e.g., by means of a dry nitrogen ("sweep gas") flow.

In an embodiment there is provided a transparent optical device element, wherein a total thickness at the optical axis in a direction along the optical axis of:
  a. The at least one deformable lens body (640),
  b. the bendable transparent cover member (104),
  c. the passivation layer (312, 314, 742, 628),
is 1 mm or less, such as 0.75 mm or less, such as 0.5 mm or less, such as 0.400 mm or less (such as [100; 400] micrometer), such as 0.25 mm or less, such as 0.2 mm or less. A possible advantage of having a small thickness is that it enables a transparent optical device element with a very small vertical footprint, which in turn optionally allows thinner cameras with smaller vertical footprint that can then be integrated into thinner devices than presently allowed today.

In an embodiment there is provided a transparent optical device element, wherein a diameter of the optical aperture is 10 mm or less, such as 7.5 mm or less, such as 5 mm or less (such as [0.5; 4.0] mm), such as 2.5 mm or less (such as [0.5-2.4], such as [2.0-2.4] mm), such as 1.55 mm or less, such as 1 mm or less. A possible advantage of having a small diameter is that it enables a transparent optical device element, which may utilise very little area in a final application device (such as a camera) and can be installed in multiple positions for additional functionality (e.g. 3D imaging).

In an embodiment there is provided a transparent optical device element, wherein the bendable transparent cover member extends beyond inner edges of the sidewall. The sidewall surrounds the deformable lens body, and it is to be understood, that the inner edges of the sidewall correspond to the surface of the sidewall facing the deformable lens body. In other words, the bendable transparent cover member extends further away from the optical axis than the the surface of the sidewall facing the deformable lens body. A possible advantage of this is that it enables that the one or more piezoelectric actuators may be arranged so as to utilize a cantilever principle thereby amplifying the maximal radius of curvature, even in the optical aperture where no actuators are present.

In an embodiment there is provided a transparent optical device element, wherein the one or more piezoelectric actuators are placed above the bendable transparent cover member and the sidewall. An advantage of this may be, that it enables that the one or more piezoelectric actuators may be arranged so as to utilize a cantilever principle thereby amplifying the maximal radius of curvature, even in the optical aperture where no actuators are present. In a specific arrangement, the piezoelectric actuators may be arranged so that a virtual straight line drawn parallel to the optical axis through the inner edge of the sidewall will intersect the one or more piezoelectric actuators or will be within a distance from the piezoelectric actuators being comparable to their size (wherein the piezoelectric actuators may be closer to the optical axis than the inner edge of the sidewall).

In an embodiment there is provided a transparent optical device element, wherein the bendable transparent cover member comprises, such as consists of a material having a youngs modules of at least 20 GPa, such as within 20-60 GPa. An advantage of this (such as a relatively rigid cover member) may be that it enables or facilitates that the piezoelectric actuators are defining the aperture, while it is still possible to shape the cover member in the aperture (although no piezoelectric actuators are there) with the piezoelectric actuators. The bendable transparent cover member may furthermore
  have a transmittance of 98% or more for light, and/or
  a stress less than or equal to 20 MPa
  resilience to humidity, such as absorbing no H$_2$O at 1000 hrs at 85° C. and 85% RH (i.e. o significant change in stress or mass).
This may for example be realized if the bendable transparent cover member is made of glass.

In an embodiment there is provided a transparent optical device element, wherein the one or more piezoelectric actuators comprise a material with
  a transverse piezo coefficient (|d31|) being numerically equal to or larger than 50 pC/N, such as preferably numerically equal to or larger than 100 pC/N, such as preferably numerically equal to or larger than 200 pC/N, and/or a longitudinal piezo coefficient (|d33|) being numerically equal to or larger than 50 pC/N, such as being numerically equal to or larger than 100 pC/N, such as being numerically equal to or larger than preferably <−200 pC/N.

By 'numerically' is understood the absolute value, e.g., −250 is numerically larger than any number in the range ]−250; +250[. In an embodiment, the material is chosen to be a ferroelectric material, such as lead zirconate titanate (PZT). An advantage of this may be the large piezoelectric actuation effect of this material.

In an embodiment there is provided a transparent optical device element, wherein the magnification is tunable by means of actuation of the one or more piezoelectric actuators throughout a range spanning more than 5 diopters, such as 6 diopters or more, such as 7.5 diopters or more, such as 10 diopters or more, such as 12.5 diopters or more, such as 14 diopters or more. It may in general be understood, that the range spanned may include a magnification of 0 diopters, such as a range spanning 0-5 diopters, such as 0-6 diopters or more, such as 0-7.5 diopters or more, such as 0-10 diopters or more, such as 0-12.5 diopters or more, such as 0-14 diopters, such as 0-16 diopters, such as 0-20 diopters. The range spanned may include a magnification of 0 diopters and a range on both sides of zero, such as a range from/to ±2.5 diopters (i.e., from −2.5 diopters to 2.5 diopters), such as ±6 diopters or more, such as ±7.5 diopters or more, such as ±10 diopters or more, such as ±12.5 diopters or more, such as ±14 diopters, such as ±16 diopters, such as ±20 diopters.

According to a fourth aspect, there is provided a camera, a scanner or a variable optical tuner or attenuator comprising
   a. the transparent optical device element according to the first aspect, or
   b. the transparent optical device element as manufactured according to anyone of claims the first aspect.

In a more general embodiment, there is provided an optical device comprising
   a. the transparent optical device element according to the first aspect, or
   b. the transparent optical device element as manufactured according to anyone of claims the first aspect,
wherein the optical device may be any one optical device chosen from the group comprising, such as consisting of: a scanner, a camera, a variable optical tuner or attenuator, an iris, an optical image stabilisation (OIS) unit, a zoom lens, a wide angle lens.

According to a second aspect of the invention, there is provided a method for manufacturing a transparent optical device element, such as a tunable optical lens, such as a tunable optical microlens, said method comprising:
   a. Providing (S1252) an optical lens (744), comprising
      i. at least one deformable lens body surrounded by a sidewall,
      ii. a bendable transparent cover member attached to a surface of said at least one deformable lens body,
      iii. one or more piezoelectric actuators arranged for shaping said cover member into a desired shape, such as for shaping a portion of the cover member being in the optical aperture, such as the portion of the cover member being intersected by the optical axis, such as said piezoelectric actuators located above and/or below, such as on a top and/or a bottom) surface of said cover member, such as the piezoelectric actuators comprising piezoelectric actuators being located on the same and/or the opposite side of the cover membrane as the passivation layer,
   wherein said optical lens comprises an optical aperture with an optical axis, wherein the optical axis intersects the lens body and the cover member, and wherein the piezoelectric actuators are defining the optical aperture, such as being arranged so as to surround or encircle the optical aperture, such as being placed immediately adjacent but not within the optical aperture,
   b. placing (S1254) a passivation layer on said optical lens, wherein said passivation layer comprises multiple sublayers, wherein the placing of said passivation layer includes:
      i. placing (S1256) a barrier layer, such as said barrier layer being a dense metal oxide layer, such as said barrier layer being a dense metal oxide layer with a thickness within 50-3000 nm, said barrier layer forming a humidity barrier, on:
         1. at least a portion of said cover member, where said portion of said cover member is intersected by the optical axis, and
         2. said piezoelectric actuators,
      i. placing (S1258), such as subsequently placing, one or more further layers on at least said portion of said cover member being intersected by the optical axis, such as on at least a portion of said barrier layer wherein said portion of said barrier layer is intersected by the optical axis, such as above:
         1. said cover member, and
         2. said piezoelectric actuators,
      and arranged for improving an anti-reflecting property of the passivation layer,
   so that said passivation layer comprises:
      the barrier layer and
      the one or more further layers,
   and so that the passivation layer is allowing that the one or more piezoelectric actuators is arranged for shaping said cover member into a desired shape,
   and so that the passivation layer forms an anti-reflection coating for said optical lens at least along the optical axis.

In a more general embodiment, there is provided:
a. Providing an optical lens, comprising
   i. at least one deformable lens body surrounded by a sidewall,
   ii. a bendable transparent cover member attached to a surface of said at least one deformable lens body,
   iii. one or more piezoelectric actuators arranged for shaping said cover member into a desired shape, such as said piezoelectric actuators located above and/or below, such as on a top and/or a bottom) surface of said cover member, such as the piezoelectric actuators comprising piezoelectric actuators being located on the same and/or the opposite side of the cover membrane as the passivation layer,
wherein said optical lens comprises an optical aperture with an optical axis,
wherein the optical axis intersects the lens body and the cover member,
   b. placing a passivation layer on said optical lens, wherein said passivation layer comprises multiple sublayers, wherein the placing of said passivation layer includes:

i. placing a barrier layer, said barrier layer forming a humidity barrier, such as said barrier layer being a dense metal oxide layer, such as said barrier layer being a dense metal oxide layer with a thickness within 50-3000 nm, on:
   1. at least a portion of said cover member, where said portion of said cover member is intersected by the optical axis, and
   2. said piezoelectric actuators,
ii. placing, such as subsequently placing, or more further layers on at least said portion of said cover member being intersected by the optical axis, such as on at least a portion of said barrier layer wherein said portion of said barrier layer is intersected by the optical axis, such as above:
   1. said cover member, and
   2. said piezoelectric actuators,
so that said passivation layer comprises:
   the barrier layer and
   the one or more further layers,
and so that the passivation layer is allowing that the one or more piezoelectric actuators is arranged for shaping said cover member into a desired shape,
and so that the passivation layer forms an anti-reflection coating for said optical lens at least along the optical axis.

It may be understood, that the method may be seen as comprising a sequence of steps, which need not necessarily be carried out in the order they are presented. In embodiments, however, the sequence of steps is carried out in the order in which it is presented.

The barrier layer may be placed directly onto, such as deposited directly onto, the piezoelectric actuators and/or the cover member.

In an embodiment there is provided a method for manufacturing a transparent optical device element, wherein after placing the barrier layer on
1. at least a portion of said cover member, where it is intersected by the optical axis, and
2. said piezoelectric actuators,
the method further comprises:
placing an electrically conductive layer on said piezoelectric actuators, such a metal layer, such as Au or AlCu, such as a layer comprising Au/TiN, Au/TaN or AlCu/TiN and
electrically connecting the electrically conductive layer to the one or more piezoelectric actuators,
so as to form an electrical contact to the one or more piezoelectric actuators, such as to an upper electrode of said actuators.

An advantage of this embodiment may be, that it facilitates that the processing relating to the electrical contacting does not harm the actuators or the cover member, such as the aperture portion of the cover member, since said processing is done at least partially after forming the barrier layer.

In an embodiment there is provided a method for manufacturing a transparent optical device element, wherein after placing the barrier layer on
1. at least a portion of said cover member, where it is intersected by the optical axis, and
2. said piezoelectric actuators,
the method further comprises:
placing an electrically conductive layer on said piezoelectric actuators, such a metal layer, such as Au or AlCu, such as a layer comprising Au/TiN, Au/TaN or AlCu/TiN, and
electrically connecting the electrically conductive layer to the one or more piezoelectric actuators,
so as to form an electrical contact to the one or more piezoelectric actuators, and wherein
Placing the one or more further layers located above said barrier layer takes place after
placing the electrically conductive layer, and
electrically connecting the electrically conductive layer to the one or more piezoelectric actuators.

An advantage of this embodiment may be, that the one or more further layers (such as remaining layers of the ARC), are not placed there until after the electrical contacting has taken place, which may ensure that the one or more further layers do not suffer from the processing steps related to the electrical contacting.

In an alternative embodiment, there is provided a method for manufacturing a transparent optical device element, wherein after placing the barrier layer on
1. at least a portion of said cover member, where it is intersected by the optical axis, and
2. said piezoelectric actuators,
the method further comprises:
placing an electrically conductive layer on said piezoelectric actuators, such a metal layer, such as Au or AlCu, such as a layer comprising Au/TiN, Au/TaN or AlCu/TiN, and
electrically connecting the electrically conductive layer to the one or more piezoelectric actuators,
so as to form an electrical contact to the one or more piezoelectric actuators, and wherein
Placing the one or more further layers located above said barrier layer takes place before
placing the electrically conductive layer, and
electrically connecting the electrically conductive layer to the one or more piezoelectric actuators.

In an embodiment there is provided a method for manufacturing a transparent optical device element, wherein after placing the barrier layer on
1. said cover member, and
2. said piezoelectric actuators,
the method further comprises
adding a stress compensation layer, such as a silicon nitride layer, at least partially covering the one or more piezoelectric actuators.

The stress compensation layer is a layer for tuning (such as increasing) cover member strength and/or tuning radius of curvature of the final device, such as the cover member. The stress compensation layer may be a relatively hard material, having predictable stress (such as enabling being deposited in a predictable and repeatable manner in certain ranges of stress being relevant for practical purposes) and/or being inert (such as inert being non-reactive to typical atmospheric elements such as $H_2O$, $O_2$, $N_2$, $CO_2$, etc., and typical chemicals used in processing, e.g., weak acids, bases, solvents etc). The stress compensation layer may be beneficial for controlling stress in the cover member, bolstering the mechanical strength of the cover member and/or enhance the passivating properties of the passivation layer, e.g., by increasing humidity passivation.

In an embodiment there is provided a method for manufacturing a transparent optical device element, wherein the barrier layer is placed on the optical lens, such as on the cover member and the piezoelectric actuators, in an oxidative environment, such as deposited by a method which does not contain residual hydrogen or a reducing environment. An advantage of employing an oxidative environment, may be that it facilitates employing materials, which cannot withstand a reducing environment. In an embodiment, the barrier layer is deposited on the optical lens by ALD using ozone as the catalytic precursor. An advantage of this may be that it enables forming a dense and conformal layer.

In an embodiment there is provided a method for manufacturing a transparent optical device element, wherein placing the barrier layer comprises depositing the barrier layer by a thin film deposition method, such as deposited via a thin film deposition method chosen from the group comprising:
physical vapour deposition (PVD), such as any one of: sputtering, evaporation, IAD,
chemical vapour deposition (CVD), such as any one of: PECVD, SACVD, LPCVD, APCVD, and
atomic layer deposition (ALD),
and/or wherein placing
the one or more further layers comprises depositing a metal nitrate layer (such as any one of: TiN, TaN, TiAlN, TaAlN) by a thin film deposition method, such as deposited via a thin film deposition method chosen from the group comprising:
physical vapour deposition (PVD), such as any one of: sputtering, evaporation, IAD,
chemical vapour deposition (CVD), such as any one of: PECVD, SACVD, LPCVD, APCVD, and
atomic layer deposition (ALD), According to a third aspect of the invention, there is provided use of
a. the transparent optical device element according to any one of claims the first aspect, or
b. a transparent optical device element as manufactured according to any one of claims the second aspect,
such as use for obtaining one or more images.

In alternative embodiments, the transparent optical device element referred to, may be use for scanning identification marks, such as barcodes and/or retinas, or attenuating light of specific wavelengths The first, second and third aspect of the present invention may each be combined with any of the other aspects. These and other aspects of the invention will be apparent from and elucidated with reference to the embodiments described hereinafter.

BRIEF DESCRIPTION OF THE FIGURES

The transparent optical device element according to the invention will now be described in more detail with regard to the accompanying figures. The FIGS. show one way of implementing the present invention and is not to be construed as being limiting to other possible embodiments falling within the scope of the attached claim set.

DETAILED DESCRIPTION OF AN EMBODIMENT

The type, sequence and flow of manufacturing steps in the production of a piezoelectric microlens are relevant to determining its end performance and reliability. Key requirements for a device with good performance and reliability may comprise characteristics such as, low stress in the glass membrane (such as <30 MPa), a piezo with good electrical characteristics in terms of a low leakage current (<30 nA/mm$^2$), breakdown voltage in excess of 40 V and piezoelectric transverse coefficient ($e_{31,f}$) in excess of −12 C/m$^2$ and piezo stack which is resistant to high temperature and high humidity (eg 85° C. and 85% RH) in biased operation. In addition to having low stress, the glass membrane should preferably also be resistant to high temperature and high humidity as well as having sufficient optical quality (transmittance higher than 95% and reflectivity <2%) for utilization as a lens component in a camera.

Figure 1:
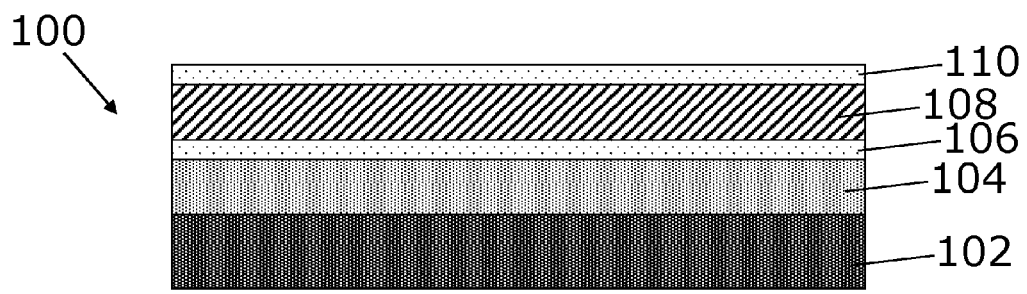
FIGS. 1-6 illustrate steps in a manufacturing method.

FIG. 1 illustrates a layered structure 100 comprising (starting from below) a silicon substrate 102 and a layer of glass which forms the cover member 104.

In general, the manufacturing process of the microlens (referred to as the TLens®) may begin with a glass bonded to or deposited onto substrate (typically silicon) wafer of which the glass required must be of a low stress state and good homogeneity. The glass may advantageously also contain low defect quality in order to achieve good optical performance. The glass on silicon wafer may be prepared by the way of glass to silicon wafer bonding, for example by anodic or fusion bonding; or by chemical vapour deposition (CVD) such as low pressure chemical vapour deposition (LPCVD), plasma enhanced chemical vapor deposition (PECVD), sub-atmospheric chemical vapour deposition (SACVD) and atmospheric pressure chemical vapour deposition (APCVD); or by physical vapor deposition (PVD) by way of sputtering, evaporation or pulsed laser deposition; or by liquid phase deposition, such as sol-gel deposition, spray pyrolysis and hydrolysis.

The layered structure 100 furthermore comprise a lower electrically conductive layer comprising platinum 106, a piezoelectric layer 108 comprising, for example, lead zirconium titanate (PZT), PNZT, PLZT, BNT, KNN or BST, an upper electrically conductive layer comprising platinum 110, wherein the layered structure 100 forms a starting point for a method for manufacturing an exemplary transparent optical device element.

More generally, after deposition of the glass, the next step may be to deposit the piezoelectric stack comprising a bottom electrode 106, piezoelectric layer 108 (eg PZT, PNZT, PLZT, KNN, BNT, BST etc.) and top electrode. Examples of the top and bottom electrode that may be used include TiN, TiAlN, TiW, TiAlON, Pt, Pd, PdOx, IrPt alloys, Au, Ag, Ru, RuOx, (Ba, Sr, Pb)RuO$_3$, (Ba,Sr)RuO$_3$, or LaNiO$_3$ and/or any alloy/composite thereof. The temperature, plasma conditions (if present), annealing conditions and atmosphere before and after deposition are relevant for controlling the required properties and must be matched to the unique properties of the glass-on-silicon (GOS) wafer. The layers of the electrode and piezoelectric may be deposited by any PVD method (Eg sputtering, evaporation, pulsed laser deposition) or CVD method (E.g. MOCVD) and or chemical solution deposition (i.e. the sol-gel method). The layers may not be deposited or annealed at a temperature since it may destroy or significantly impair the properties of the GOS wafer and specifically the properties of the glass on the silicon wafer. The deposition and post-treatment of the piezoelectric layers may advantageously also not be done in a way which generates excessive stress in the wafer and maintained as low as possible.

Figure 2:
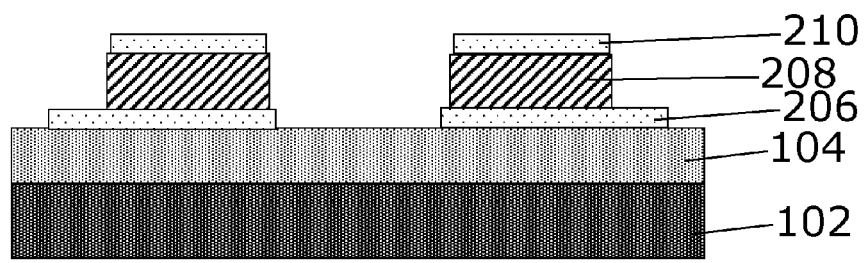

FIG. 2 shows the layer structure 102 after patterning of the piezoelectric stack, i.e., where the piezoelectric actuators have been formed, such as one or more piezoelectric actuators comprising a bottom electrode 206, a piezoelectric material layer 208 and a top electrode 210.

More generally, subsequent to the deposition of the piezoelectric stack, the piezoelectric stack may be patterned so as to form the piezoelectric actuators. The first layer requiring pattering is the top electrode which can be done using a wet or dry etch approach, depending on the exact nature of the bottom and top electrode materials used. Thereafter may the piezoelectric layer be patterned followed thereafter by the bottom electrode. A relevant aspect of these etching processes are mask deposition and preparation for the etch, etch control, impact/removal of etch residues and impact of etch environment on the properties of the critical functional piezoelectric layer. For example, if dry etching is used to etch the top electrode, the taper angle of the polymer mask can be required to be of a sufficiently low angle so as to prevent the formation of any polymer-containing etch residues (known as 'fences') on the edge of the un-etched layer. Any residues can in principle have a significant impact on the reliability of the finished device.

Furthermore, in exemplary embodiments wherein a piezoelectric layer is etched, it is possible to use wet or dry etching with wet etching considered to be the cheaper alternative. During the wet etch process, it is possible to achieve reasonably good etch control using a combination of acidic solutions. At the final device level, this may in principle cause problems due to the etch method used, which leaves a steep edged sidewall which may be challenging to subsequently coat by another film to protect the integrity and performance of the piezoelectric in an aggressive environment during reliability testing. This phenomenon may further change the requirements of the passivation coating in order to properly cover and protect the secluded or recessed regions of the piezoelectric layer.

Figure 3:
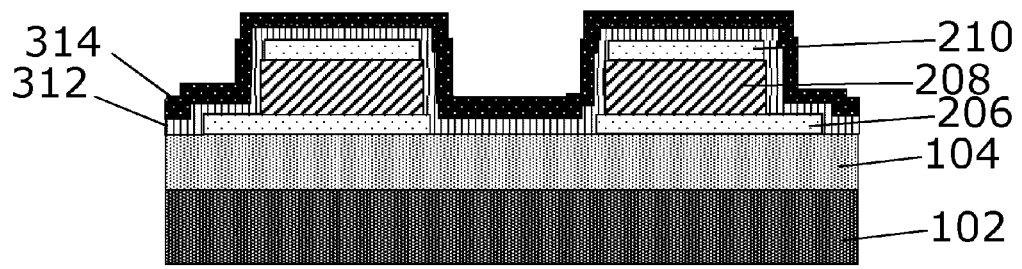

FIG. 3 shows the result of a subsequent processing step, wherein a barrier layer 312 has been applied and wherein a primary sublayer 314 has been applied. Said barrier layer comprising a dense and conformal layer of Al$_2$O$_3$ which ensures that it adequately coats and protects all open areas of the piezoelectric actuator from humidity.

In an alternative embodiment, Al$_2$O$_3$ may be 'capped' with another layer which is a barrier to liquid H$_2$O, since some forms of Al$_2$O$_3$ may unstable in the presence of liquid H$_2$O, for example some forms of Al$_2$O$_3$ deposited by ALD or other method. Said primary sublayer 314 is relatively thicker than subsequently placed secondary sublayers (shown in FIG. 6), and the primary sublayer in the present embodiment is an oxide layer, such as SiO$_2$.

More generally, after patterning of the piezoelectric stack and opening of the optical aperture it is then necessary to protect the piezoelectric stack and glass membrane from moisture, mechanically and prevent electrical shorts by coating the piezoelectric stack in a passivation layer.

Figure 4:
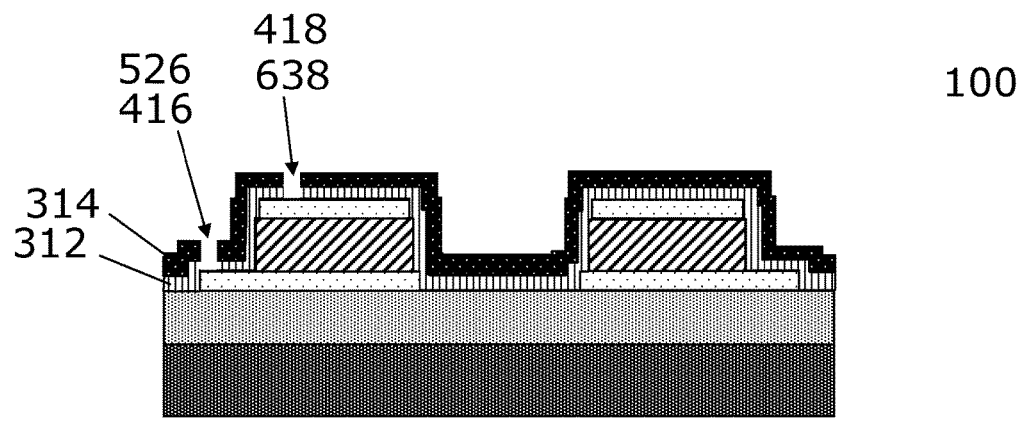

FIG. 4 shows the result of a subsequent processing step, wherein openings have been formed in the barrier layer 312 and primary sublayer 314, such as enabling electrically accessing the lower electrode via opening 416 and to the upper electrode via opening 418. The openings may be formed by selective etching.

Figure 5:
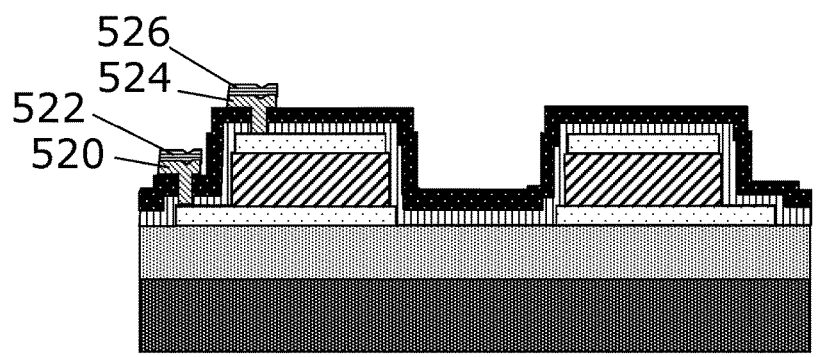

FIG. 5 shows the result of a subsequent processing step, wherein one or more areas above the piezoelectric actuators comprise an electrically conductive layer, such as an electrically conductive layer comprising a TiN layer 520 and an AlCu layer 522 electrically connected to the lower electrode, or an electrically conductive layer comprising a TiN layer 524 and an AlCu layer 526 electrically connected to the upper electrode.

Figure 6:
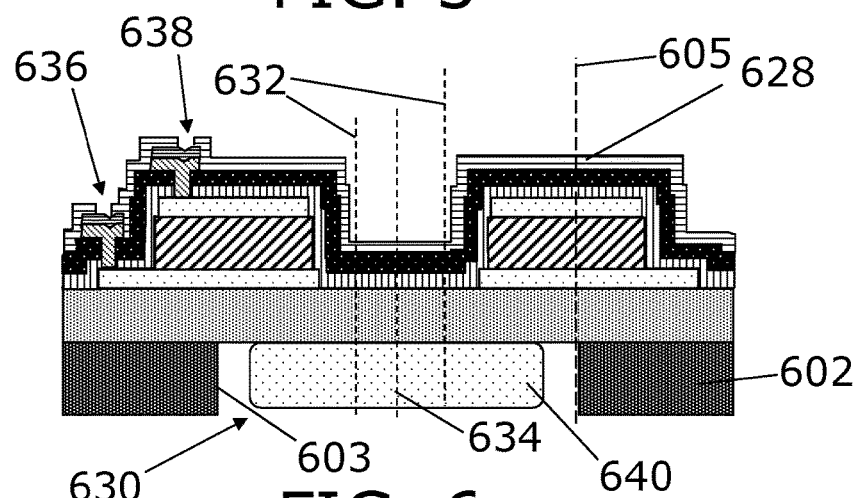

FIG. 6 shows the result of a subsequent processing step, wherein one or more further layers 628 are placed above the barrier layer, and wherein there is provided openings in the one or more further layers, such as enabling electrically accessing the lower electrode via opening 636 and the upper electrode via opening 638. The openings may be formed by selective etching. The figure furthermore indicates an aperture region between the piezoelectric actuators, as indicated by dotted lines 632. The figure furthermore indicates an aperture region between the piezoelectric actuators, as indicated by dotted lines 632. The figure furthermore indicates an optical axis between the piezoelectric actuators, as indicated by dotted line 634. The figure furthermore shows a throughgoing hole 630 in the silicon substrate, which enables that optical device element to be transparent. The throughgoing hole comprises a deformable lens body 640, where the surrounding remaining portions of the silicon substrate acts as a surrounding support 602, which may also be referred to as sidewall or support structure. The inner edge 603 is indicated in the left side (where it is noted that the openings in the support 602 and also in the piezoelectric actuators defining the aperture 632 is generally circular). On the corresponding right side, a virtual line 605 parallel with the optical axis 634 and through the inner edge 603 of the sidewall 602 intersects the piezoelectric actuator.

In addition, the coatings may advantageously be deposited onto piezoelectric stack such that no blistering or degradation of the piezoelectric stack occurs. This means that the deposition environment may advantageously not be aggressive for the piezoelectric stack and specific processes selected that will not be degradative or that any susceptible or reactive elements of the piezoelectric stack are improved. For example, the deposition of optical coatings by PECVD often contain a reducing environment rich in hydrogen and if the piezoelectric stack contains elements that are reactive to the hydrogen e.g. platinum or other catalysts, then it is possible that degradation of the piezoelectric stack occurs via blistering, depending on the electrodes being used. A solution to this problem is to ensure that the first layer deposited on to the patterned piezoelectric stack is deposited using a deposition process in an oxidative environment or non-reactive electrodes are used.

Furthermore, the properties of the layer deposited must also be sufficiently adequate for the properties of the passivation layer in terms of adequate moisture barrier, optically good (ie low absorbance characteristics) and well-defined, predictable stress characteristics. Such a layer may be deposited by a CVD or PVD process in an oxidative environment. PVD techniques such as sputtering or evaporation can both be done in an oxygen rich environment and can be useful for this purpose. CVD methods are typically not as commonly done in a oxidative environment but one particularly useful CVD deposition method with good step coverage using an oxidative environment is atomic layer deposition (ALD). In an ozone (oxygen) rich environment it is possible to deposit the critical first barrier or optical layer onto the piezoelectric step in such as $Al_2O_3$, $SiO_2$, $ZrO_2$, $TiO_2$, $HfO$, $Ta_2O_5$, $SiON$, $MgO$, $Y_2O_3$, $Sc_2O_3$, $CeO_2$, $Nb_2O_5$, $Lif_2$, $MgF_2$, $ThF_4$, $CeF_3$, $PbF_2$, etc. may be deposited with good optical properties. The barrier layer according to the present example yields an water vapour transmission rate (WVTR) value within $10^{-3}$ to $10^{-4}$ g/m²/day.

In addition, layers such as $Al_2O_3$ are also very useful hydrogen barriers which means that if any subsequent processing is desirable in a reducing environment available using a cheaper method such as by PECVD, then this will prevent any negative reactions occurring associated with the hydrogen. Furthermore, once the $Al_2O_3$ is sufficiently thick and is coated with a cover layer, then it also may act as a very resilient and/or robust moisture barrier, assuming its thickness and thickness of the other layers have been optically optimized for high transmittance and low reflectivity.

An additional feature of the device which was briefly mentioned earlier but will now be outlined in slightly more detail, is that of the conducting moisture barrier layer. This layer may be advantageous in order to ensure the device is capable of surviving the basic humidity and temperature requirements of operation and may be advantageous for providing a seal on the device which is exposed after the passivation is opened for electrical contact. The conductive layer must be a good hydrogen barrier in addition to being a good moisture barrier and must be deposited in a non-hydrogen rich environment preferably. This means that a PVD process or CVD process in an inert or slightly oxidative environment are preferred. For example, the conductive hydrogen barrier layer may contain TiN, TiAlN, or TiAlON. Alternatively, the hydrogen susceptibility of the electrodes may be improved by removing any hydrogen catalytic material and replacing with a conductive material which is less hydrogen catalytic. For example, Pt, Pd, PdOx, may be replaced with IrPt alloys, Ag, Au, Ru, RuOx, (Ba, Sr, Pb)RuO3, TiW, (Ba,Sr)RuO3, or LaNiO3.

Figure 7:
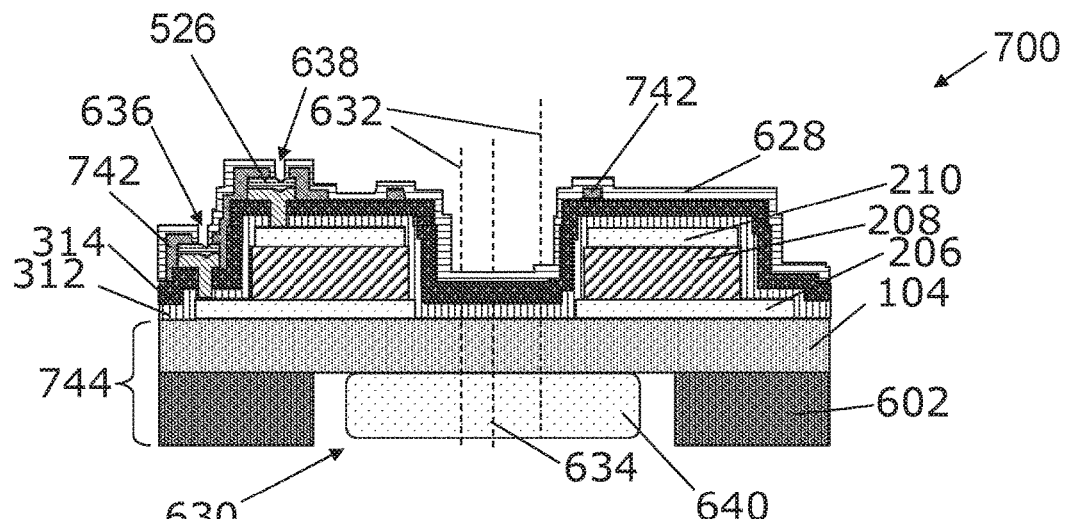
FIGS. 7-8 illustrate an transparent optical device element.

FIG. 7 shows a more detailed embodiment corresponding to the embodiment in FIG. 6, except the embodiment in FIG. 7 furthermore features a silicon nitride layer (SiN) 742. More specifically, FIG. 7 shows a transparent optical device element 700 comprising:
a. An optical lens 744, comprising
  i. at least one deformable lens body 640 surrounded by a sidewall 602,
  ii. a bendable transparent cover member 104 attached to a surface of said at least one deformable lens body,
  iii. one or more piezoelectric actuators 206, 208, 210 arranged for shaping said cover member into a desired shape,
  wherein said optical lens 744 comprises an optical aperture 632 with an optical axis 634, wherein the optical axis intersects the lens body and the cover member,
b. a passivation layer 312, 314, 742, 628 placed on said optical lens, said passivation layer comprising multiple sublayers including:
  i. a barrier layer 312, said barrier layer forming a humidity barrier, and being located on:
    1. at least a portion of said cover member, where said portion of said cover member is intersected by the optical axis, and
    2. said piezoelectric actuators,
  ii. one or more further layers 628 located on at least said portion of said cover member being intersected by the optical axis,
  wherein said passivation layer forms an anti-reflection coating for said optical lens 744 at least along the optical axis 634.

Figure 8:
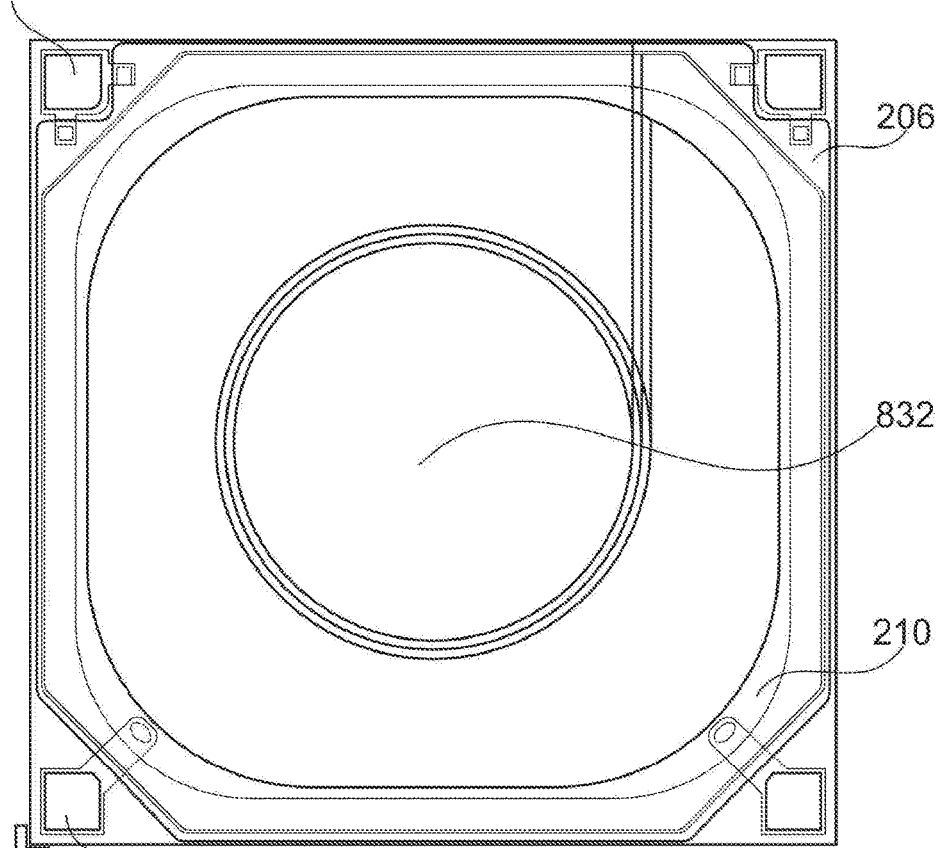

FIG. 8 shows a top-view of the embodiment shown in FIG. 7 (where FIGS. 1-7 represent side-views), with the optical aperture 832 in the middle. The optical aperture is the inner circular ring (the inner circular ring is the border of the piezoelectric actuator on the outside of the aperture), which in the present embodiment is 1.55 micrometer. The slightly larger circular ring shows the inner edge of the sidewall (also referred to as support structure).

Figure 17:
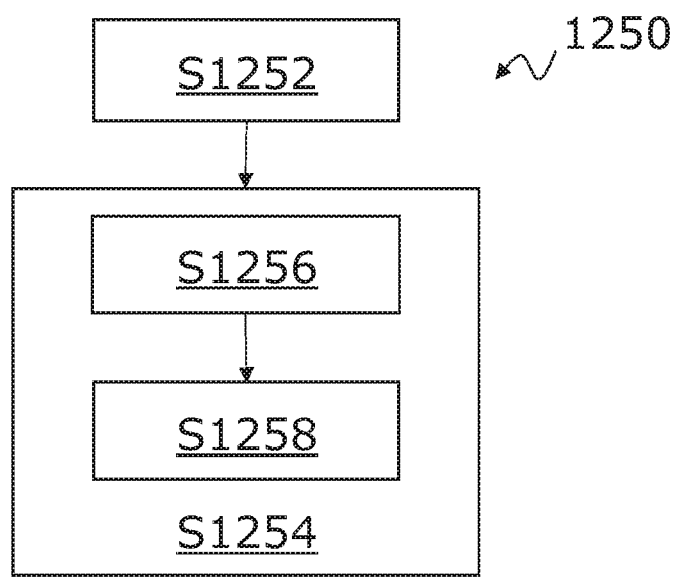
FIG. 17 shows a flow chart illustrating a manufacturing method.

FIG. 17 illustrates a method S1250 for manufacturing a transparent optical device element 700, said method comprising:
c. Providing S1252 an optical lens 744, comprising
  i. at least one deformable lens body surrounded by a sidewall,
  ii. a bendable transparent cover member attached to a surface of said at least one deformable lens body,
  iii. one or more piezoelectric actuators arranged for shaping said cover member into a desired shape,
  wherein said optical lens comprises an optical aperture with an optical axis,
  wherein the optical axis intersects the lens body and the cover member,
d. placing S1254 a passivation layer on said optical lens, wherein said passivation layer comprises multiple sublayers, wherein the placing of said passivation layer includes:
  i. placing S1256 a barrier layer, said barrier layer forming a humidity barrier, on:
    1. at least a portion of said cover member, where said portion of said cover member is intersected by the optical axis, and
    2. said piezoelectric actuators,
  ii. placing S1258 one or more further layers on at least said portion of said cover member being intersected by the optical axis,
  so that said passivation layer comprises:
  the barrier layer and
  the one or more further layers,
  and so that the passivation layer is allowing that the one or more piezoelectric actuators is arranged for shaping said cover member into a desired shape,
  and so that the passivation layer forms an anti-reflection coating for said optical lens at least along the optical axis.

Exemplary embodiments are described in the following examples. In all FIGS. 9-16, the left and right side, respectively, refer to "top electrode contact over PZT" and "over glass", where the former is understood to illustrate a composition of the passivation layer (and also indicating a piezoelectric actuator, cf., Pt-PZT-Pt) along a line parallel with the optical axis and traversing a piezoelectric actuator, such as at least partially at a position where electrical contact is made, and the latter illustrates a composition of the passivation layer (also indicating the cover member, cf., 'glass') along the optical axis in the aperture. Where 'steps' are referred to (such as 'step 1', 'step 2', 'step 1+2', etc.), they are understood to indicate a sequence of deposition of the respective layers, such as layers corresponding to 'step 1' are deposited before layers corresponding to 'step 2'. These examples describe specific, exemplary embodiments, and it is conceivable and encompassed by the present invention, that features in one example may be integrated into another example.

Example 1

This example starts with ALD $Al_2O_3$ layer landing directly onto the glass and platinum electrodes/PZT of the piezo stack. The next layer is a thick layer of silicon dioxide (primary sublayer) which has a wide thickness tolerance for good optical performance. Thereafter the top metal ('electrically conductive layer' which is simultaneously forming a conductive humidity and hydrogen barrier) are placed and finally, the 4 remaining layers (one or more further layers) comprising the optical stack. The transmittance of the optical device utilizing the ARC described in example 1 is 96%. The passivation layer according to the present example yields an WVTR value of $10^{-4}$ g/m²/day.

Figure 9:
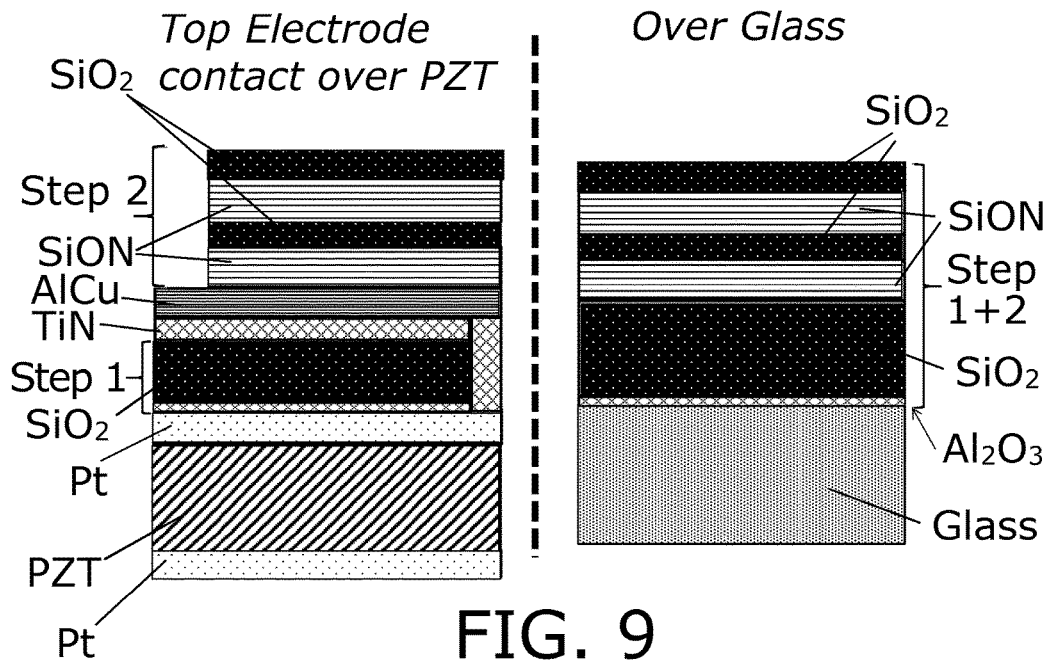
FIGS. 9-16 illustrate exemplary passivation layer compositions

FIG. 9 illustrates the layers according to Example 1. The exact thicknesses of the layers (i.e., the passivation layer above the optical aperture intersected by the optical axis) are as follows:

| Layer | Thickness (Å) |
| --- | --- |
| $Al_2O_3$ (Bottom) | 400 |
| $SiO_2$ | 6000 |
| SiON | 1440 |
| $SiO_2$ | 1670 |
| SiON | 710 |
| $SiO_2$ (Top) | 830 |

Example 2

This example starts with ALD $Al_2O_3$ layer landing directly onto the glass and platinum electrodes/PZT of the piezo stack. The next layer is a thick layer of silicon dioxide (primary sublayer) which has a wide thickness tolerance for good optical performance. Thereafter a SiN layer (forming a stress compensation layer) is deposited for extra stress or humidity requirements followed by the top metal ('electrically conductive layer' which is simultaneously forming a conductive humidity and hydrogen barrier). On top of the top metal finally, the 4 remaining layers (one or more further layers) comprising the optical stack are deposited. The transmittance of the optical device utilizing the ARC described in example 2 is 95%. The passivation layer according to the present example yields an WVTR value of $10^{-4}$ g/m²/day.

Figure 10:
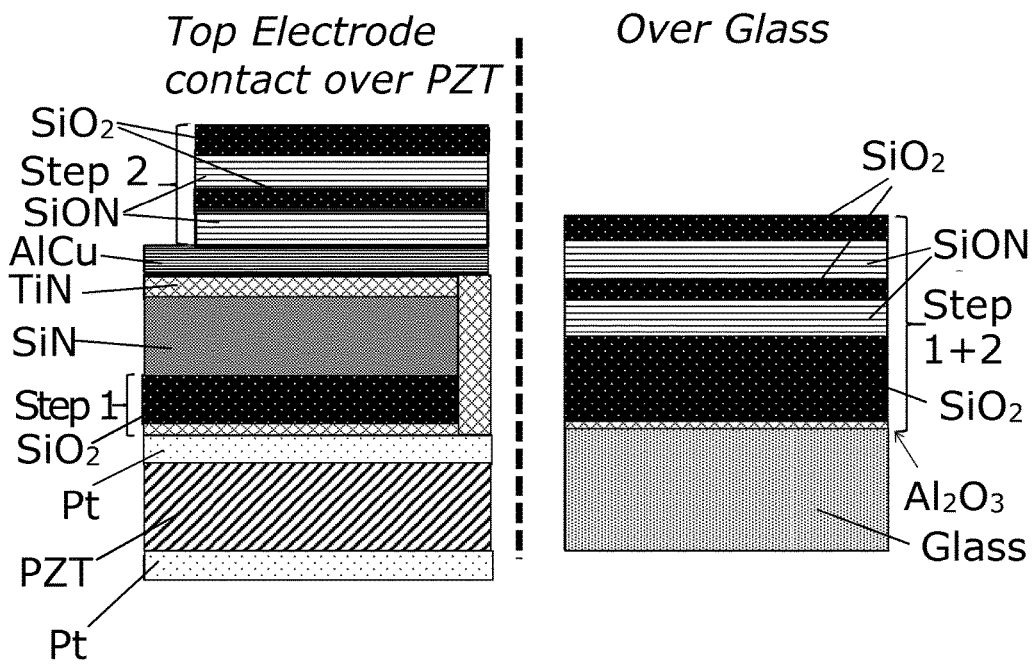

FIG. 10 illustrates the layers according to Example 2. The exact thicknesses of the layers (of the ARC passivation, i.e., the passivation layer above the optical aperture intersected by the optical axis) are as in example 1.

Example 3

This example starts with ALD $Al_2O_3$ layer landing directly onto the glass and platinum electrodes/PZT of the piezo stack. The next layer is a thin layer of silicon dioxide followed by a thicker layer (i.e., primary sublayer) of SiON which has good optical performance and is a good humidity barrier. Thereafter the top metal ('electrically conductive layer' which is simultaneously forming a conductive humidity and hydrogen barrier) are placed. The final layer of the 4 layers (one or more further layers) comprising the optical stack is finally deposited. The transmittance of the optical device utilizing the ARC described in example 3 is 95%. The passivation layer according to the present example yields an WVTR value of $10^{-4}$ g/m²/day.

Figure 14:
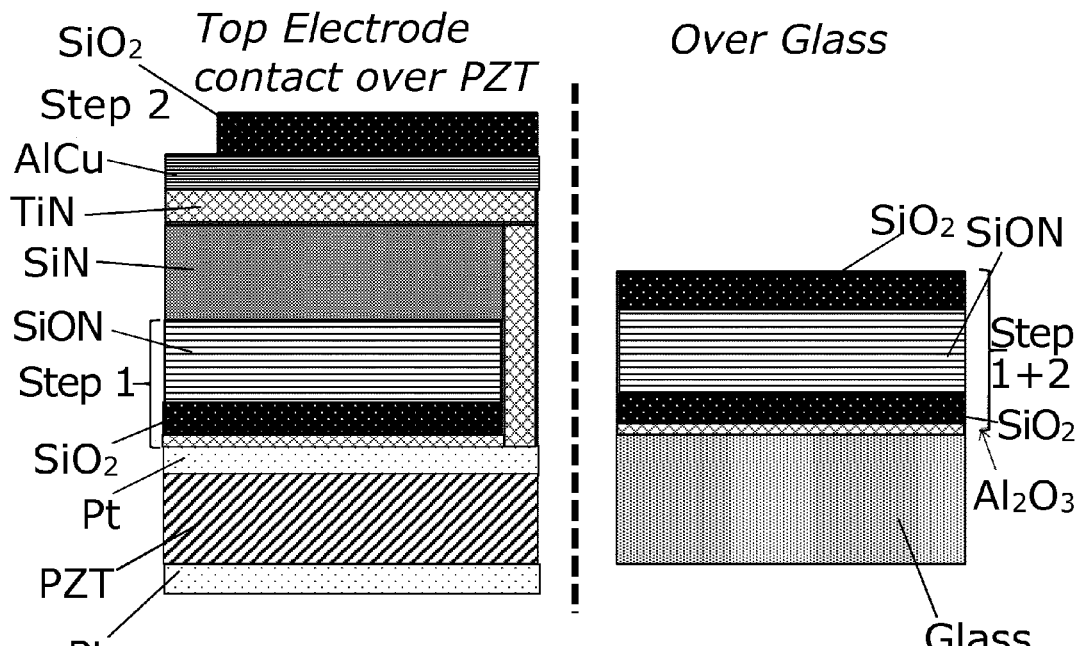

FIG. 14 illustrates the layers according to Example 3. The exact thicknesses of the layers (of the ARC passivation, i.e., the passivation layer above the optical aperture intersected by the optical axis) are as follows:

| Layer | Thickness (Å) |
| --- | --- |
| $Al_2O_3$ (Bottom) | 400 |
| $SiO_2$ | 200 |
| SiON | 9000 |
| $SiO_2$ | 800 |

Example 4

This example starts with ALD $Al_2O_3$ layer landing directly onto the glass and platinum electrodes/PZT of the piezo stack. The next layer is a thin layer of silicon dioxide followed by a thicker layer (i.e., primary sublayer) of SiON which has good optical performance and is a good humidity barrier followed by a relatively thin layer of silicon dioxide. Thereafter the top metal ('electrically conductive layer' which is simultaneously conductive humidity and hydrogen barrier) are placed. The top metal may be patterned using lift-off method so as to reduce the patterning effects on the thickness of the top layer of the ARC and improve the ARC performance. The transmittance of the optical device utilizing the ARC described in example 4 is 95%. The passivation layer according to the present example yields an WVTR value of $10^{-4}$ g/m²/day.

Figure 15:
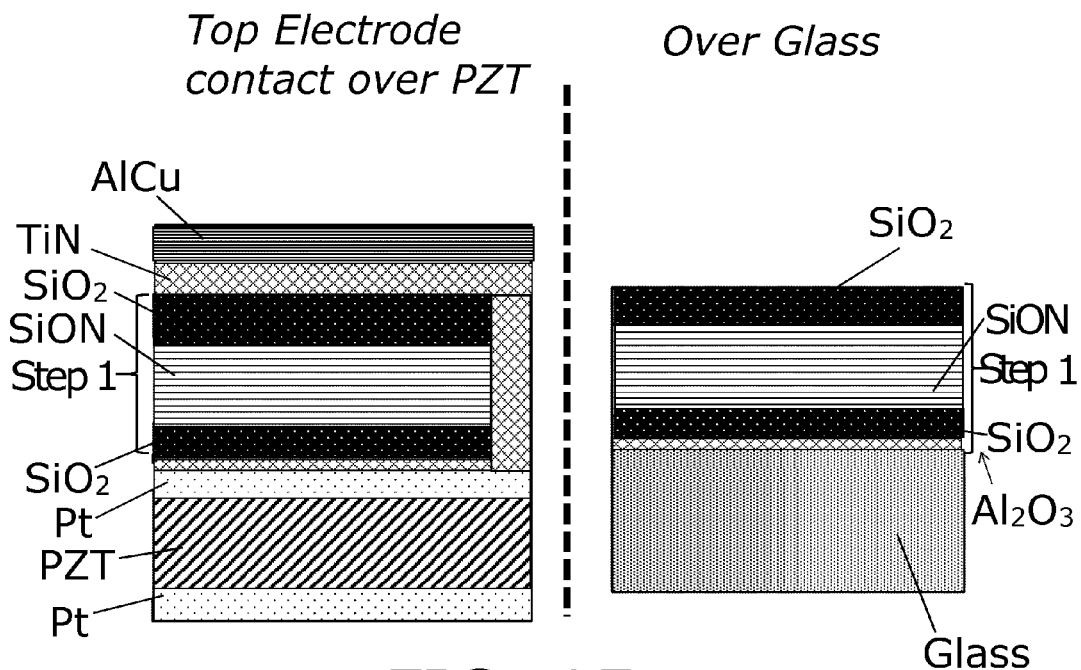

FIG. 15 illustrates the layers according to Example 3. The exact thicknesses of the layers (of the ARC passivation, i.e., the passivation layer above the optical aperture intersected by the optical axis) are as follows:

| Layer | Thickness (Å) |
| --- | --- |
| $Al_2O_3$ (Bottom) | 400 |
| $SiO_2$ | 200 |
| SiON | 9000 |
| $SiO_2$ | 800 |

Example 5

This example starts with ALD $Al_2O_3$ layer landing directly onto the glass and platinum electrodes/PZT of the piezo stack. The next layer is a thick layer of silicon dioxide (primary sublayer) which has a wide thickness tolerance for good optical performance. Thereafter the top metal ('electrically conductive layer' which is simultaneously forming a conductive humidity and hydrogen barrier) are placed and then a SiN layer (forming a stress compensation layer) is deposited for extra stress or humidity requirements. On top of the SiN finally, the 4 remaining layers (one or more further layers) comprising the optical stack are deposited. The transmittance of the optical device utilizing the ARC described in example 5 is 95%. The passivation layer according to the present example yields an WVTR value of $10^{-4}$ g/m²/day.

Figure 11:
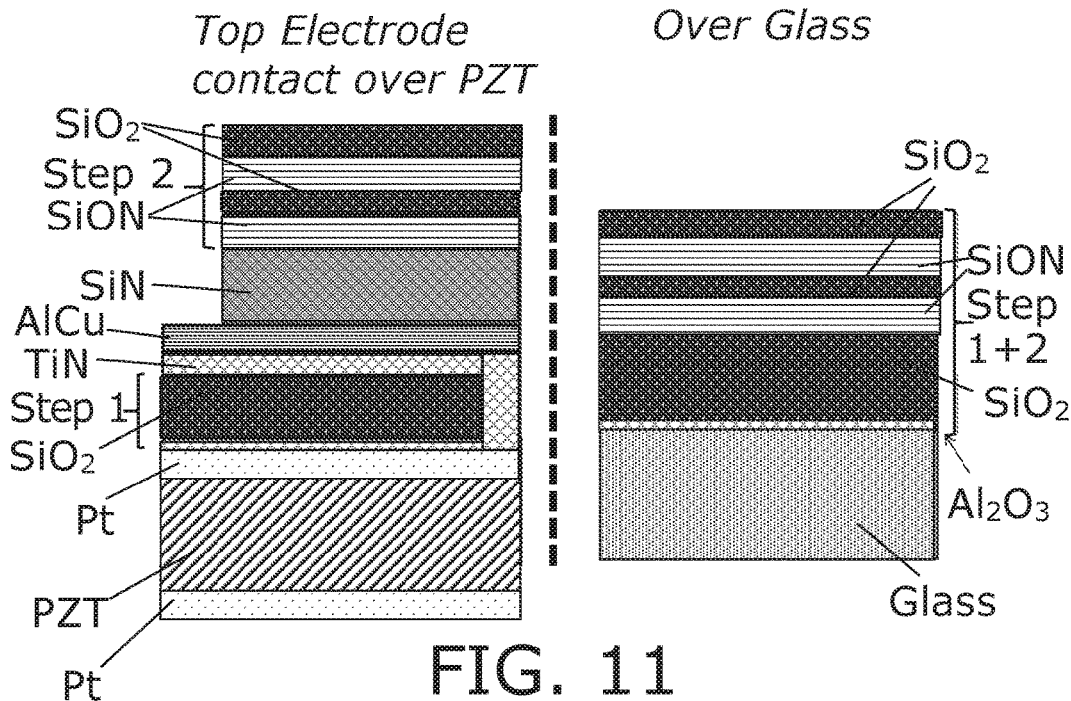

FIG. 11 illustrates the layers according to Example 5. The exact thicknesses of the layers (of the ARC passivation, i.e., the passivation layer above the optical aperture intersected by the optical axis) are as in example 1.

Example 6

This example starts with ALD $Al_2O_3$ layer landing directly onto a glass barrier layer and platinum electrodes/PZT of the piezo stack. The pre-existence of the glass barrier adds an additional (buffer) layer for ARC optimization and reduces the glass passivation requirements in the subsequent layers. The glass barrier may in particular be advantageous for protecting the cover member (the 'glass' in the figure) during processing of the piezoelectric actuators. The next layer is a thick layer of silicon dioxide (primary sublayer) which has a wide thickness tolerance for good optical performance. Thereafter a SiN layer (forming a stress compensation layer) is deposited for extra stress or humidity requirements followed by the top metal ('electrically conductive layer' which is simultaneously forming a conductive humidity and hydrogen barrier). Alternatively the SiN could be placed beneath the top metal as in Example 2. On top of the top metal finally, the 4 remaining layers (one or more further layers) comprising the optical stack are deposited. The transmittance of the optical device utilizing the ARC described in example 6 is 95%. The passivation layer according to the present example yields an WVTR value of $10^{-4}$ g/m²/day.

Figure 12:
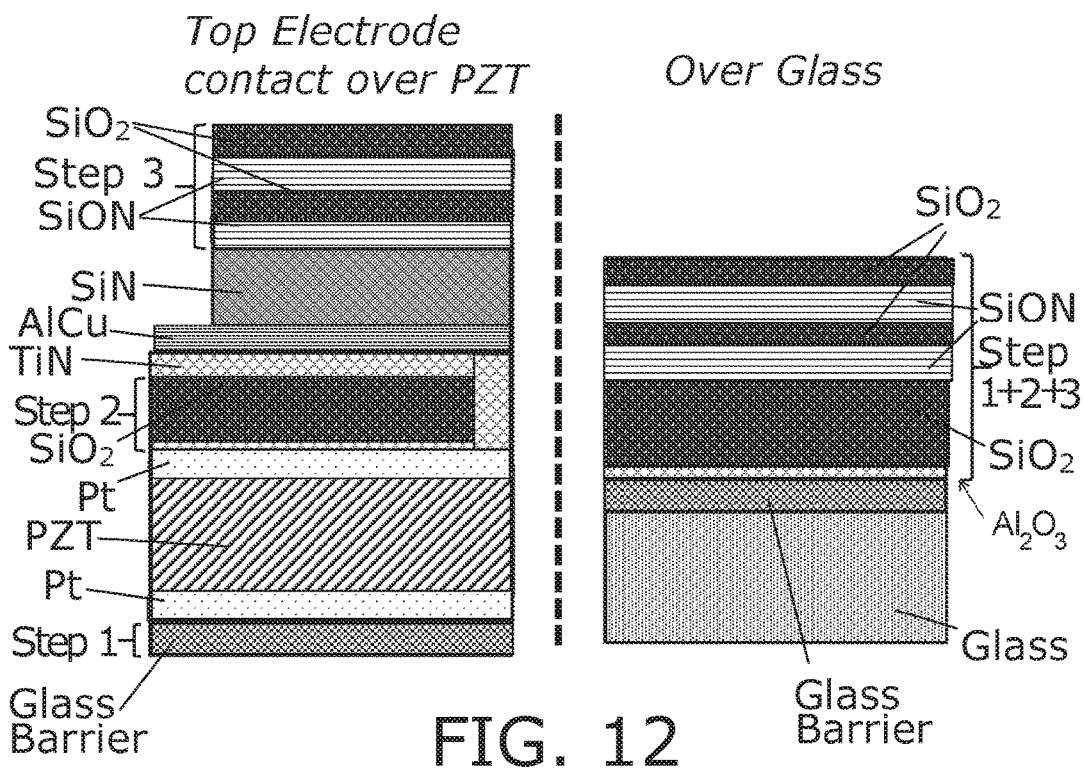

FIG. 12 illustrates the layers according to Example 6. The exact thicknesses of the layers (of the ARC passivation, i.e., the passivation layer above the optical aperture intersected by the optical axis) are as in example 1.

Example 7

This example starts with ALD $Al_2O_3$ layer landing directly onto a glass barrier layer and platinum electrodes/PZT of the piezo stack. The pre-existence of the glass barrier adds an additional (buffer) layer for ARC optimization and reduces the glass passivation requirements in the subsequent layers. The glass barrier may in particular be advantageous for protecting the cover member (the 'glass' in the figure) during processing of the piezoelectric actuators. The next layer is a thick layer of silicon dioxide (primary sublayer) which has a wide thickness tolerance for good optical performance. On top of a top metal ('electrically conductive layer' which is simultaneously forming a conductive humidity and hydrogen barrier) finally, the 4 remaining layers (one or more further layers) comprising the optical stack are deposited. The transmittance of the optical device utilizing the ARC described in example 7 is 95%. The passivation layer according to the present example yields an WVTR value of $10^{-4}$ g/m²/day.

Figure 13:
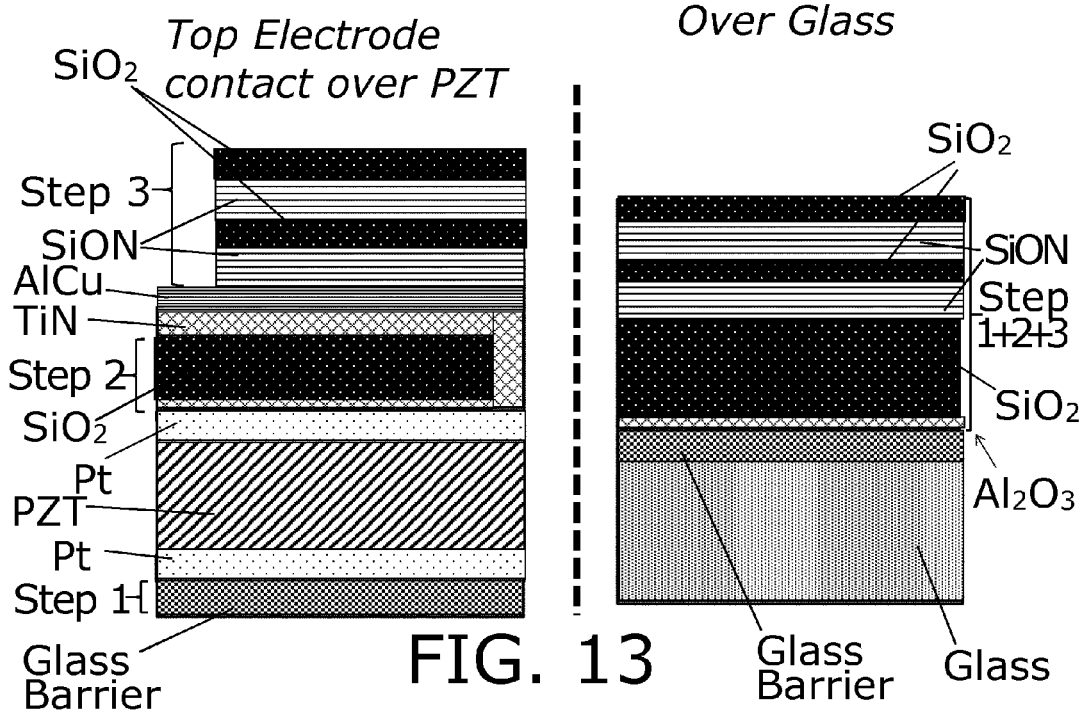

FIG. 13 illustrates the layers according to Example 7. The exact thicknesses of the layers (of the ARC passivation, i.e., the passivation layer above the optical aperture intersected by the optical axis) are as in example 1.

Example 8

Figure 16:
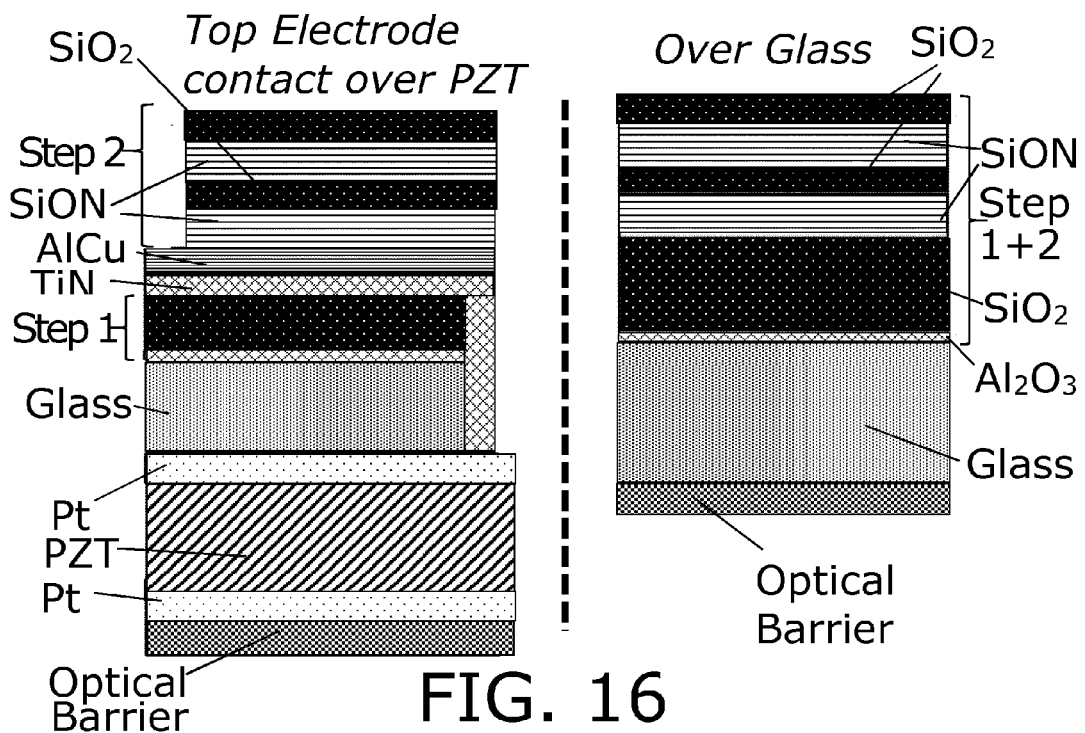

This example starts with an optical barrier and piezoelectric being placed on the underside of the glass. The optical requirements for the optical barrier on the underside of the glass are less restrictive than (for the passivation layer) on the top side of the glass, however, it must still have the same passivation requirements for the piezoelectric. Electrical contacts may be made from the top side (as depicted in FIG. 16) or from the under side and stress compensation layer may also be deposited on the top side (or bottom side) although not depicted in the figure. If electrical contacts and/or stress compensation layer are made from the top side, it is advantageous to use the ARC passivation method described herein (e.g. example 1). After placement of the glass, ALD $Al_2O_3$ is placed directly onto the glass followed by a thick layer of silicon dioxide (primary sublayer) which has a wide thickness tolerance for good optical performance. Thereafter a SiN layer (forming a stress compensation layer) may or may not be deposited for extra stress or humidity requirements followed by the top metal ('electrically conductive layer' which is simultaneously forming a conductive humidity and hydrogen barrier). On top of the top metal finally, the 4 remaining layers (one or more further layers) comprising the optical stack are deposited. The transmittance of the optical device utilizing the ARC described in example 8 is 95%. The passivation layer according to the present example yields an WVTR value of $10^{-4}$ g/m²/day.

FIG. 16 illustrates the layers according to Example 8. The exact thicknesses of the layers (of the ARC passivation, i.e., the passivation layer above the optical aperture intersected by the optical axis) are as in example 1.

Figure 18:
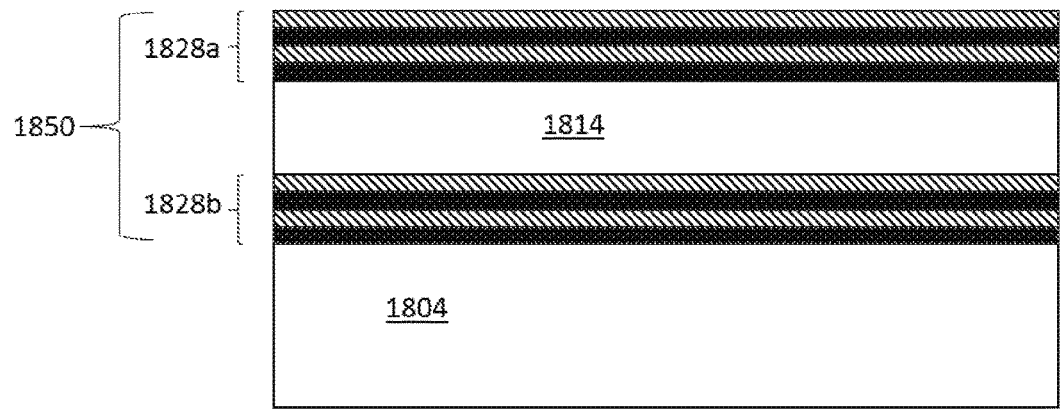
FIG. 18 shows a portion of a transparent optical device element corresponding to a cross-section of a portion within the optical aperture, with bendable transparent cover membrane 1804, a passivation layer 1850 comprising a plurality of secondary (relatively thin) sublayers 1828b below a primary (relatively thick) sublayer 1814, and a plurality of secondary (relatively thin) sublayers 1828b above a primary (relatively thick) sublayer 1814.

FIG. 18 shows a portion of a transparent optical device element corresponding to a cross-section of a portion within the optical aperture, with bendable transparent cover membrane 1804, a passivation layer 1850 comprising a plurality of secondary (relatively thin) sublayers 1828b below a primary (relatively thick) sublayer 1814, and a plurality of secondary (relatively thin) sublayers 1828b above a primary (relatively thick) sublayer 1814.

Figure 19:
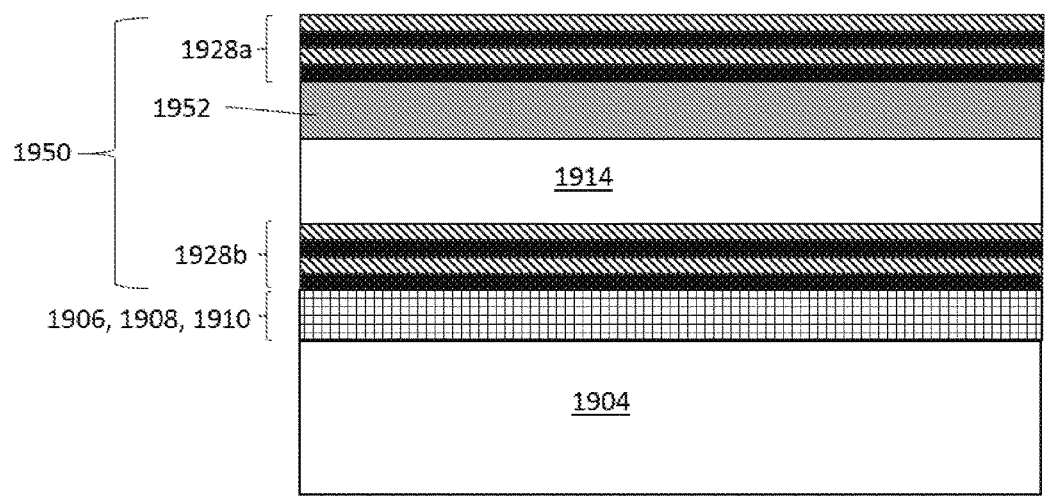
FIG. 19 shows a portion of a transparent optical device element corresponding to a cross-section of a portion outside the optical aperture but at a position of piezoelectric actuators with resistors (indicated with elements 1906, 1908, 1910), with bendable transparent cover membrane 1904, a passivation layer 1950 comprising a plurality of secondary (relatively thin) sublayers 1928b below a primary (relatively thick) sublayer 1914, and a plurality of secondary (relatively thin) sublayers 1928b above a primary (relatively thick) sublayer 1914. Furthermore is shown an intermediate layer 1952, which may be a metal contact layer and/or a stress compensation layer. It may also be possible to include an intermediate layer within the passivation layer, such as described above, in areas over the optical aperture of the bendable transparent cover member, such as between layers 1814 and 1828a illustrated in FIG. 18.

FIG. 19 shows a portion of a transparent optical device element corresponding to a cross-section of a portion outside the optical aperture but at a position of piezoelectric actuators with resistors (indicated with elements 1906, 1908, 1910), with bendable transparent cover membrane 1904, a passivation layer 1950 comprising a plurality of secondary (relatively thin) sublayers 1928b below a primary (relatively thick) sublayer 1914, and a plurality of secondary (relatively thin) sublayers 1928b above a primary (relatively thick) sublayer 1914. Furthermore is shown an intermediate layer 1952, which may be a metal contact layer and/or a stress compensation layer. It may also be possible to include an intermediate layer within the passivation layer, such as described above, in areas over the optical aperture of the bendable transparent cover member, such as between layers 1814 and 1828a illustrated in FIG. 18.

To sum up, there is presented a transparent optical device element (700) comprising an optical lens (744), comprising one or more piezoelectric actuators (206, 208, 210), wherein said optical lens (744) comprises an optical aperture (632), and wherein the optical device element furthermore comprises a passivation layer (312, 314, 742, 628) placed on said optical lens, said passivation layer comprising a barrier layer (312) forming a humidity barrier, and being located on at least a portion of said cover member, where said portion of said cover member is intersected by the optical axis, and on said piezoelectric actuators, and wherein the passivation layer furthermore comprises one or more further layers (628) located on at least said portion of said cover member being intersected by the optical axis, wherein said passivation layer forms an anti-reflection coating for said optical lens (744) at least along the optical axis (634).

Exemplary embodiments E1-E15 are inserted below:

E1. A transparent optical device element (700) comprising:
   a. An optical lens (744), comprising
      i. at least one deformable lens body (640) surrounded by a sidewall (602),
      ii. a bendable transparent cover member (104) attached to a surface of said at least one deformable lens body,
      iii. one or more piezoelectric actuators (206, 208, 210) arranged for shaping said cover member into a desired shape,
   wherein said optical lens (744) comprises an optical aperture (632) with an optical axis (634), wherein the optical axis intersects the lens body and the cover member,
   b. a passivation layer (312, 314, 742, 628) placed on said optical lens, said passivation layer comprising multiple sublayers including:
      i. a barrier layer (312), said barrier layer forming a humidity barrier, and being located on:
         1. at least a portion of said cover member, where said portion of said cover member is intersected by the optical axis, and
         2. said piezoelectric actuators,
      ii. one or more further layers (628) located on at least said portion of said cover member being intersected by the optical axis,
   wherein said passivation layer forms an anti-reflection coating for said optical lens (744) at least along the optical axis (634).

E2. A transparent optical device element (700) according to any one of the preceeding embodiments, wherein the passivation layer comprises:
   a relatively thick sublayer being located on said cover member, where the relatively thick sublayer is intersected by the optical axis, and
   one or more relatively thin sublayers being located on said cover member, where the one or more relatively thin sublayers are intersected by the optical axis,
   and wherein the relatively thick sublayer is thicker than each of the one or more relatively thin sublayers,
   and wherein the relatively thick sublayer is layer is placed between:
      at least a portion of said cover member,
      and
      at least a portion of the one or more relatively thin sublayers.

E3. A transparent optical device element (700) according to any one of the preceding embodiments, wherein one or more areas of the passivation layer above the one or more piezoelectric actuators comprise an electrically conductive layer, enabling electrically accessing the one or more piezoelectric actuators, and/or a stress compensation layer (742), wherein said electrically conductive layer and/or said stress compensation layer (742) is placed between:
   at least a portion of the barrier layer
   and
   at least a portion of the one or more further layers.

E4. A transparent optical device element (700) according to embodiment E2, wherein one or more areas of the passivation layer above the one or more piezoelectric actuators comprise an electrically conductive layer, enabling electrically accessing the one or more piezoelectric actuators, and/or a stress compensation layer (742), wherein said electrically conductive layer and/or said stress compensation layer (742) is placed between:
   at least a portion of the barrier layer and the relatively thick sublayer,
   and
   at least a portion of the one or more relatively thin sublayers.

E5. A transparent optical device element (700) according to any one of the preceeding embodiments, wherein the passivation layer is arranged so as to form a hydrogen barrier covering at least a portion of the piezoelectric actuators.

E6. A transparent optical device element (700) according to embodiment E5, wherein the electrically conductive layer is forming a hydrogen barrier and/or a humidity barrier.

E7. A transparent optical device element (700) according to any one of the preceeding embodiments, wherein the transparent optical device element has an average transmittance of 95% or more for light travelling along the optical axis.

E8. A transparent optical device element (700) according to any one of the preceeding embodiments, wherein said passivation layer facilitates that the device can be operational in ambient conditions.

E9. A transparent optical device element (700) according to any one of the preceeding embodiments, wherein said passivation layer enables forming a humidity barrier wherein:
   a. the water vapour transmission rate (WVTR) is below $10^{-1}$ g/m²/day, such as below $10^{-3}$ g/m²/day, such as below $10^{-5}$ g/m²/day.

and/or wherein
   b. the Oxygen transmission rate (OTR) is below $10^{-1}$ scc/m²/day, such as below $10^{-3}$ sccc/m²/day, such as below $10^{-6}$ scc/m²/day.

E10. A camera, a scanner or a variable optical tuner or attenuator comprising
   a. the transparent optical device element (700) according to any one of embodiments E1-E10, or
   b. the transparent optical device element as manufactured according to anyone of embodiments E11-E14.

E11. A method (S1250) for manufacturing a transparent optical device element (700), said method comprising:
   a. Providing (S1252) an optical lens (744), comprising
      i. at least one deformable lens body surrounded by a sidewall,
      ii. a bendable transparent cover member attached to a surface of said at least one deformable lens body,
      iii. one or more piezoelectric actuators arranged for shaping said cover member into a desired shape,
   wherein said optical lens comprises an optical aperture with an optical axis,
   wherein the optical axis intersects the lens body and the cover member,
   b. placing (S1254) a passivation layer on said optical lens, wherein said passivation layer comprises multiple sublayers, wherein the placing of said passivation layer includes:

i. placing (S1256) a barrier layer, said barrier layer forming a humidity barrier, on:
1. at least a portion of said cover member, where said portion of said cover member is intersected by the optical axis, and
2. said piezoelectric actuators,
ii. placing (S1258) one or more further layers on at least said portion of said cover member being intersected by the optical axis,
so that said passivation layer comprises:
the barrier layer and
the one or more further layers,
and so that the passivation layer is allowing that the one or more piezoelectric actuators is arranged for shaping said cover member into a desired shape,
and so that the passivation layer forms an anti-reflection coating for said optical lens at least along the optical axis.

E12. A method (S1250) for manufacturing a transparent optical device element (700) according embodiment E11,
wherein after placing the barrier layer on
1. at least a portion of said cover member, where it is intersected by the optical axis, and
2. said piezoelectric actuators,
the method further comprises:
placing an electrically conductive layer on said piezoelectric actuators, and
electrically connecting the electrically conductive layer to the one or more piezoelectric actuators,
so as to form an electrical contact to the one or more piezoelectric actuators, and wherein
Placing the one or more further layers located above said barrier layer takes place after
placing the electrically conductive layer, and
electrically connecting the electrically conductive layer to the one or more piezoelectric actuators.

E13. A method (S1250) for manufacturing a transparent optical device element (700) according to any one of embodiments E11-E12, wherein after placing the barrier layer (312) on
1. said cover member, and
2. said piezoelectric actuators,
the method further comprises
adding a stress compensation layer (742) at least partially covering the one or more piezoelectric actuators.

E14. A method (S1250) for manufacturing a transparent optical device element (700) according to any one of embodiments E11-E13, wherein the barrier layer (312) is placed on the optical lens (744) in an oxidative environment.

E15. Use of
a. the transparent optical device element (700) according to any one of embodiments E1-E10, or
b. a transparent optical device element as manufactured according to any one of embodiments E11-E14,
for obtaining one or more images.

For the above embodiments E1-E15, it may be understood that reference to preceding 'embodiments' may refer to preceding embodiments within embodiments E1-E15.

Although the present invention has been described in connection with the specified embodiments, it should not be construed as being in any way limited to the presented examples. The scope of the present invention is set out by the accompanying claim set. In the context of the claims, the terms "comprising" or "comprises" do not exclude other possible elements or steps. Also, the mentioning of references such as "a" or "an" etc. should not be construed as excluding a plurality. The use of reference signs in the claims with respect to elements indicated in the figures shall also not be construed as limiting the scope of the invention. Furthermore, individual features mentioned in different claims, may possibly be advantageously combined, and the mentioning of these features in different claims does not exclude that a combination of features is not possible and advantageous.

The invention claimed is:
1. A transparent optical device element comprising:
a. An optical lens, comprising:
i. at least one deformable lens body surrounded by a sidewall,
ii. a bendable transparent cover member attached to a surface of said at least one deformable lens body,
iii. one or more piezoelectric actuators configured to shape said cover member into a desired shape,
wherein said optical lens comprises an optical aperture with an optical axis, wherein the optical axis intersects the lens body and the cover member, and wherein the piezoelectric actuators define the optical aperture
b. a passivation layer placed on said optical lens, said passivation layer comprising multiple sublayers comprising:
i. a barrier layer, said barrier layer forming a humidity barrier, and being located on:
1. at least a portion of said cover member, where said portion of said cover member is intersected by the optical axis, and
2. said piezoelectric actuators,
ii. one or more further layers located on at least said portion of said cover member being intersected by the optical axis and configured to improve an anti-reflecting property of the passivation layer,
wherein said passivation layer forms an anti-reflection coating for said optical lens at least along the optical axis.

2. The transparent optical device element according to claim 1, wherein the passivation layer comprises:
a primary sublayer located on said cover member, where the primary sublayer is intersected by the optical axis, and
one or more secondary sublayers located on said cover member, where the one or more secondary sublayers are intersected by the optical axis,
and wherein the primary sublayer is thicker than each of the one or more secondary sublayers,
and wherein the primary sublayer is a layer placed between:
at least a portion of said cover member,
and
at least a portion of the one or more secondary sublayers.

3. The transparent optical device element according to claim 1, wherein one or more areas of the passivation layer above the one or more piezoelectric actuators comprises an electrically conductive layer, which is configured to allow electrical access to the one or more piezoelectric actuators, wherein said electrically conductive layer is placed between:
at least a portion of the barrier layer
and
at least a portion of the one or more further layers.

4. The transparent optical device element according to claim 1, wherein one or more areas of the passivation layer above the one or more piezoelectric actuators comprises a stress compensation layer, wherein said stress compensation layer is placed between:
- at least a portion of the barrier layer
- and
- at least a portion of the one or more further layers.

5. The transparent optical device element according to claim 1, further comprising at least one structure element located onto said piezoelectric actuators and surrounding said optical aperture;
- wherein said at least one structure element has an external diameter between a diameter of the bendable transparent cover member and a diameter of said optical aperture; and
- wherein said bendable transparent cover member is configured to provide mechanical stability to the transparent optical device element and to allow for tuning of the curvature of the bendable transparent cover member between a negative radius of curvature and a positive radius of curvature.

6. The transparent optical device element according to claim 1, wherein said at least one deformable lens body comprises polymer.

7. The transparent optical device element according to claim 1, wherein said at least one deformable lens body comprises a polymer network of cross-linked or partly cross-linked polymers and a miscible oil or combination of oils.

8. The transparent optical device element according to claim 1, wherein said at least one deformable lens body comprises an elastic modulus larger than 300 Pa, a refractive index is above 1.35, and an absorbance in the visible range less than 10% per millimeter thickness.

9. The transparent optical device element according to claim 2, wherein one or more areas of the passivation layer above the one or more piezoelectric actuators comprises an electrically conductive layer, which is configured to allow electrical access to the one or more piezoelectric actuators, and/or a stress compensation layer, wherein said electrically conductive layer and/or said stress compensation layer is placed between:
- at least a portion of the barrier layer and the primary sublayer,
- and
- at least a portion of the one or more secondary sublayers.

10. The transparent optical device element according to claim 1, wherein the passivation layer is configured to form a hydrogen barrier covering at least a portion of the piezoelectric actuators.

11. The transparent optical device element according to claim 1, wherein said passivation layer is configured to allow the formation of a humidity barrier wherein:
a. the water vapour transmission rate (WVTR) is below $10^{-1}$ g/m$^2$/day, below $10^{-3}$ g/m$^2$/day, or below $10^{-5}$ g/m$^2$/day,
and/or wherein
b. the Oxygen transmission rate (OTR) is below $10^{-1}$ scc/m$^2$/day, below $10^{-3}$ sccc/m$^2$/day, or below $10^{-6}$ scc/m$^2$/day,
when the device element is placed at standard atmospheric conditions, or at 20 degree Celsius, 100 kPA, and 50% relative humidity.

12. The transparent optical device element according to claim 1, wherein a total thickness at the optical axis in a direction along the optical axis of:
a. The at least one deformable lens body,
b. the bendable transparent cover member, and
c. the passivation layer,
is 1 mm or less, 0.75 mm or less, 0.5 mm or less, 0.400 mm or less, 0.25 mm or less, or 0.2 mm or less.

13. The transparent optical device element according to claim 1, wherein the bendable transparent cover member extends beyond the edges of the sidewall.

14. The transparent optical device element according to claim 1, wherein the one or more piezoelectric actuators are placed above the edge of the sidewall.

15. The transparent optical device element according to claim 1, wherein the bendable transparent cover member comprises a material having a youngs modules of at least 20 GPa, or within 20-60 GPa.

16. The transparent optical device element according to claim 1, wherein the one or more piezoelectric actuators comprise a material with:
- a transverse piezo coefficient (|d31|) that is numerically equal to or larger than 50 pC/N, 100 pC/N, or 200 pC/N,
and/or
- a longitudinal piezo coefficient (|d33|) that is numerically equal to or larger than 50 pC/N, 100 pC/N, 200 pC/N.

17. The transparent optical device element according to claim 1, wherein the magnification is tunable by actuation of the one or more piezoelectric actuators throughout a range spanning more than 5, 6, 7.5, 10, 12.5, 14, 16, or 20 diopters or more.

18. A method for manufacturing a transparent optical device element, said method comprising:
a. Providing an optical lens, comprising
  i. at least one deformable lens body surrounded by a sidewall,
  ii. a bendable transparent cover member attached to a surface of said at least one deformable lens body,
  iii. one or more piezoelectric actuators configured to shape said cover member into a desired shape,
wherein said optical lens comprises an optical aperture with an optical axis, wherein the optical axis intersects the lens body and the cover member, and wherein the piezoelectric actuators define the optical aperture;
b. placing a passivation layer on said optical lens, wherein said passivation layer comprises multiple sublayers, wherein the placing of said passivation layer comprises:
  i. placing a barrier layer, said barrier layer forming a humidity barrier, on:
    1. at least a portion of said cover member, where said portion of said cover member is intersected by the optical axis, and
    2. said piezoelectric actuators,
  ii. placing one or more further layers on at least said portion of said cover member being intersected by the optical axis, and configured to improve an anti-reflecting property of the passivation layer,
so that said passivation layer comprises:
  the barrier layer and
  the one or more further layers,
and so that the passivation layer allows the one or more piezoelectric actuators to shape said cover member into a desired shape,
and so that the passivation layer forms an anti-reflection coating for said optical lens at least along the optical axis.

19. A method for obtaining an image comprising:
Providing the transparent optical device element according to claim 1, and obtaining one or more images from said transparent optical device element.

20. A camera, a scanner or a variable optical tuner or attenuator comprising
the transparent optical device element according to claim 1.

* * * * *